United States Patent
Nakagawa et al.

(10) Patent No.: US 6,514,832 B1
(45) Date of Patent: Feb. 4, 2003

(54) GUNN DIODE, NRD GUIDE GUNN OSCILLATOR, FABRICATING METHOD OF GUNN DIODE AND STRUCTURE FOR ASSEMBLY OF THE SAME

(75) Inventors: Atsushi Nakagawa, Kamifukuoka (JP); Kenichi Watanabe, Kamifukuoka (JP)

(73) Assignee: New Japan Radio Co., Ltd., Tokyo (JP)

( * ) Notice: Subject to any disclaimer, the term of this patent is extended or adjusted under 35 U.S.C. 154(b) by 0 days.

(21) Appl. No.: 09/541,097

(22) Filed: Mar. 31, 2000

Related U.S. Application Data

(62) Division of application No. 09/299,017, filed on Apr. 29, 1999, now Pat. No. 6,344,658.

(30) Foreign Application Priority Data

| Apr. 28, 1998 | (JP) | 10-118536 |
| Sep. 11, 1998 | (JP) | 10-259005 |
| Sep. 11, 1998 | (JP) | 10-259006 |
| Oct. 8, 1998 | (JP) | 10-286892 |

(51) Int. Cl.$^7$ ............................................. H01L 21/76
(52) U.S. Cl. ..................... 438/412; 438/380; 438/718
(58) Field of Search .................................. 438/380, 411, 438/412, 706, 712, 718

(56) References Cited

U.S. PATENT DOCUMENTS

| 3,836,988 A | 9/1974 | Board |
| 5,418,181 A * | 5/1995 | Ohkubo et al. ............. 438/412 |

FOREIGN PATENT DOCUMENTS

| EP | 0 587 454 | 3/1994 |

OTHER PUBLICATIONS

Patent Abstracts of Japan vol. 098, No. 009, Jul. 31, 1998. & JP 10 107338 A (Kyocera Corp), Apr. 24, 1998.

* cited by examiner

*Primary Examiner*—Carl Whitehead, Jr.
*Assistant Examiner*—Jamie L. Brophy
(74) *Attorney, Agent, or Firm*—Armstrong, Westerman & Hattori, LLP

(57) ABSTRACT

A Gunn diode which is formed by sequentially laminating a first semiconductor layer, an active layer and a second semiconductor layer onto a semiconductor substrate. The Gunn diode comprises first and second electrodes arranged on the second semiconductor layer for impressing voltage on the active layer, and a concave portion which is cut from around the first electrode in a direction of the second semiconductor layer and the active layer and which subdivides the second semiconductor layer and the active layer to which the first electrode is connected as a region which functions as a Gunn diode. Since etching for defining a region that is to function as a Gunn diode is performed by self-alignment dry etching utilizing electrode layers formed above this region as masks, variations in characteristics are restricted. There are also disclosed a NRD guide Gunn oscillator attached to the NRD guide for obtaining a high frequency oscillation output of the Gunn diode, a fabricating method of the Gunn diode, and a structure for assembly of the Gunn diode.

4 Claims, 33 Drawing Sheets

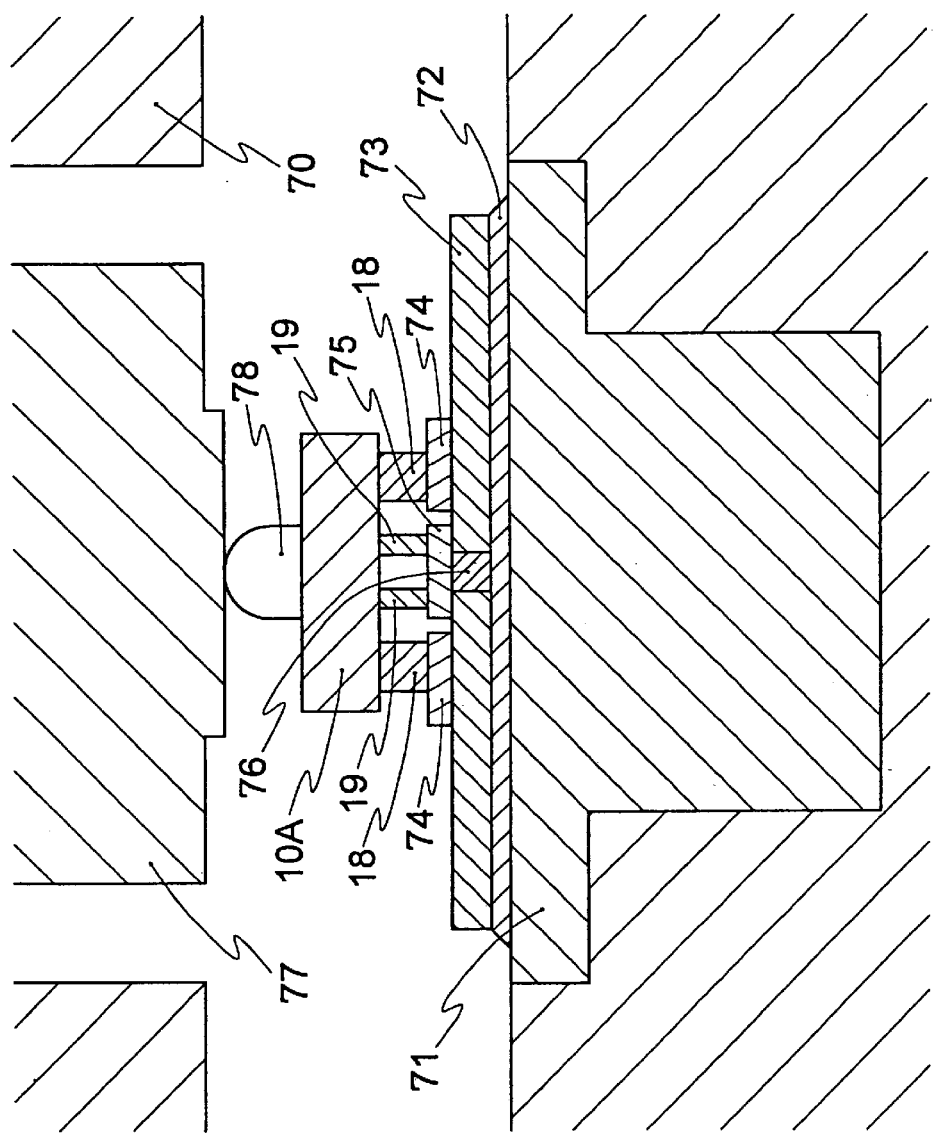

GUNN DIODE, NRD GUIDE GUNN OSCILLATOR, FABRICATING METHOD OF GUNN DIODE AND STRUCTURE FOR ASSEMBLY OF THE SAME

This application is a division of prior application Ser. No. 09/299,017, filed Apr. 26, 1996 now U.S. Pat. No. 6,344,658.

BACKGROUND OF THE INVENTION

The present invention relates to Gunn diodes used for oscillation of microwaves and millimeter waves, and is especially related to Gunn diodes which realize improvements in thermal characteristics, yield factor of good products and easy assembly to planar circuits, fabricating methods thereof and structures for assembly of the same.

The present invention also relates to NRD guide Gunn oscillators that are comprised by combining a NRD guide (Non Radiative Dielectric Waveguide) circuit and Gunn diodes.

Gunn diodes for oscillation of microwaves or millimeter waves are usually comprised of compound semiconductors such as gallium arsenide (GaAs) or indium phosphide. It is the case with such compound semiconductors that the electron mobility is several thousands of $cm^2/V\cdot sec$ and thus large in a low electric field while the mobility is decreased in case a large electric field is applied since accelerated electrodes transit to a band of large effective mass and thus causes generation of negative differential mobility within the bulk. Consequently, a negative differential conductance is caused in the current-voltage characteristics and leads to thermodynamic instability. Therefore, a domain is generated which transits from the cathode side to the anode side. Repetition of this phenomenon results in vibrating current (oscillation).

The oscillating frequency of a Gunn diode is determined by the distance of transit of the domain. In case of Gunn diodes for millimeter waves, this distance of transit needs to be extremely short (1 to 2 $\mu$m). In addition, the product of an impurity concentration and a distance of transit for the domain (active layer) needs to be set to be a specified value (e.g. $1 \times 10^{12}/cm^2$) to obtain sufficient oscillating efficiency, while the impurity concentration of the active layer becomes rather high in high frequency zones like those of millimeter waves since the oscillating frequency is non-ambiguously determined by the thickness of the active layer. The current concentration during operation is determined by the product of the impurity concentration of the active layer and a saturation electron speed, and in zones of the millimeter waves, the temperature of the active layer is increased owing to the increase in current concentration, whereby the oscillating efficiency is decreased.

In order to solve such problems, measures had been taken with conventional Gunn diodes for millimeter waves such as employing a mesa-type arrangement to use elements including the active layer of extremely small sizes, having diameters of approximately several tens of $\mu$m, and assembling the diodes within pill-type packages comprised with a heat portion made of diamond or similar material of favorable thermal conductivity which greatly affects oscillating efficiency on which the most important performance indices are dependent.

A sectional view of gallium arsenide Gunn diode element 100 of conventional mesa-type arrangement is shown in FIG. 29.

On to a semiconductor substrate 101 of high concentration n-type gallium arsenide, there are sequentially laminated, through MBE method, a first contact layer 102 of high concentration n-type gallium arsenide, an active layer 103 of low concentration n-type gallium arsenide, and a second contact layer 104 of high concentration n-type gallium arsenide, and it is employed a mesa-type arrangement in order to reduce the transit space for the electrons.

Thereafter, a rear surface of the semiconductor substrate 101 is laminated, a cathode electrode 105 is formed onto this rear surface of the semiconductor substrate 101 while an anode electrode 106 is formed on the surface of the second contact layer 104, and by performing element separation, the Gunn diode element is completed.

The Gunn diode element 100 thus obtained is built-in in a pill-type package 110 as shown in FIG. 30. This pill-type package 110 comprises a heat sink electrode 111 and a cylinder 112 of glass or ceramics that serves as an enclosure for enclosing the Gunn diode element 100, wherein the cylinder 112 is brazed by hard-soldering to the heat sink electrode 111. The Gunn diode element 100 is electrostatically attracted by a bonding tool of sapphire material or the like (not shown) and is adhered to the heat sink electrode 111.

Further, the Gunn diode element 100 and a metal layer provided at a tip of the cylinder 112 are connected by a gold ribbon 113 through thermo-compression bonding or the like. After connecting the gold ribbon 113, a lid-like metallic disk 114 is brazed onto the cylinder 112 to complete the building-in to the pill-type package 110.

An example of a structure for assembling the Gunn diode that has been built-in in the pill-type package 110 to a microstrip line 120 is shown in FIG. 31. One of the two electrodes 111, 114 of the pill-type package 110 is pierced through a hole formed in a flat insulating substrate 121 of e.g. alumina and is electrically connected to a ground electrode 122 formed on a rear surface of the flat insulating substrate 121, while the other one is connected by a gold ribbon 123 to a signal line 124 formed on the plate substrate 121 as a microstrip line.

NRD guide circuits are paid attention to as transmission lines for microwaves, especially of millimeter wave zones of not less than 30 GHz, since they present lower insertion losses than compared to microwave strip lines, and since manufacturing of transmission line is easier than compared to waveguides.

This NRD guide circuit is arranged in that a dielectric strip line, in which propagation of electromagnetic waves is performed, is pinched between two parallel plates of conductive metal. Since the opposing distance between the parallel plates is set to be not more than half of the free space wavelength of the used frequency, electromagnetic waves are intercepted and its radiation is restricted at portions other than the dielectric strip line, electromagnetic waves can be propagated with low losses along the dielectric strip line.

Oscillators arranged of such a NRD guide circuit and Gunn diodes of 35 GHz and 60 GHz zone have been developed which are capable of producing output power which are equivalent to those of waveguides.

FIG. 32(a) is a view showing an arrangement of a conventional NRD guide Gunn oscillator. This is arranged in which a mount 320 is provided in a space between parallel plates 201, 202, being mounted with a dielectric strip line 203 as well as Gunn diode 310. High frequency output oscillated by the Gunn diode 310 is derived to the dielectric strip line 203 via a resonator 330. FIG. 32(b) is a view showing a representative example of such resonator 330 comprised with a copper layer portion 331 patterned through etching a copper layer of a Teflon copper-clad laminate. By adjusting the width or length of the copper layer portion 331, the output frequency can be adjusted.

FIG. 33 is a view showing the arrangement of the mount 320. The Gunn diode 310 is set in a cylindrical portion 321, and bias voltage is applied thereto via a bias choke 340 connected to aside the cylindrical portion 321. The bias choke 340 is obtained by patterning through etching a Teflon copper-clad laminate and by hacking a portion of the laminated plate of the cylindrical portion 321 such that a copper layer portion remains to be connected to a lid for connecting portion 341. A cathode electrode of the Gunn diode 310 is connected onto a heat sink 322 of the mount 320. The heat releasing base 322 is insulated and separated from the lid 341 by a cylindrical ceramic 342, and the lid 341 is connected to an anode electrode of the Gunn diode 310 via a ribbon 343.

Conventional Gunn diode elements 100 (FIG. 30) are formed through chemical wet etching by employing a photoresist as an etching mask to obtain the above described mesa-type arrangement. However, since etching is progressed not only in the depth direction but also simultaneously in lateral directions in this etching method, it is presented a drawback during manufacture that control of the transit space of the electrons (active layer) is made very difficult, whereby ununiformity in electrical characteristics of Gunn diode element is caused.

It was also presented a drawback at the time of building-in the Gunn diode element in a pill-type package 110 that the bonding tool intercepted one's field of view during adhesion of the Gunn diode element 100 to the heat sink electrode 111 so that the heat releasing sink 111 could not be directly viewed at. Consequently, the efficiency of building-in operation was quite poor.

Further, utilization of a gold ribbon 123 (FIG. 31) for assembling the pill-type package 110 incorporated with the Gunn diode element 100 to the microstrip line 120 arranged on the plate substrate 121 resulted in generation of parasitic inductance, whereby ununiformity in electrical characteristics was caused during the assembly.

Manufacture of the above described NRD guide Gunn oscillator is difficult since it employs a special mount 320, and the operating efficiency was very poor since the substrate needed to be hacked to expose the lid 341 of the bias choke 340.

Utilization of the ribbon 343 for connecting the anode electrode of the Gunn diode 310 to the lid 341 resulted in generation of parasitic inductance, whereby variations in characteristics were caused.

It is an object of the present invention to provide Gunn diodes, fabricating methods thereof and structures for assembling the same which solve the above described problems which are caused during, fabricating building-in and assembly.

It is another object of the present invention to provide a NRD guide Gunn oscillator free of the above described problems.

SUMMARY OF THE INVENTION

For this purpose, the Gunn diode according to the first invention is a Gunn diode which is formed by sequentially laminating a first semiconductor layer, an active layer and a second semiconductor layer onto a semiconductor substrate, comprising first and second electrodes arranged on the second semiconductor layer for impressing voltage on the active layer, and a concave portion which is cut from around the first electrode in a direction of the second semiconductor layer and the active layer and which subdivides the second semiconductor layer and the active layer to which the first electrode is connected as a region which functions as a Gunn diode.

The Gunn diode according to a second invention is so arranged that a conductive film is provided within the concave portion for shorting between the second electrode and the first semiconductor layer of the first invention.

The Gunn diode according to the third invention is so arranged that the first and second electrodes are formed of an underlying electrode layer and conductive protrusions successive to the underlying electrode layer such that their upper surfaces assume a substantially identical level height.

The Gunn diode according to the fourth invention is so arranged that the conductive protrusion of the first electrode is formed substantially in a central portion and in that the conductive protrusions of the second electrode are formed at both sides thereof in the first to third inventions.

The Gunn diode according to the fifth invention is so arranged that an area for the first electrode is set to be not more than 1/10 of an area for the second electrode in the first to fourth inventions.

The Gunn diode according to the sixth invention is so arranged that there are provided at least two first electrodes and concave portions which have been cut from around the first electrodes in the first to fifth inventions.

The Gunn diode according to the seventh invention is so arranged that the semiconductor substrate, the first semiconductor layer, the active layer and the second semiconductor layer are formed of compound semiconductors such as gallium arsenide or indium phosphide in the first to sixth inventions.

The Gunn diode according to the eighth invention is so arranged that the second semiconductor layer and the active layer being successive to the second electrode are substituted as a single semiconductor layer or a conductive layer in the first to seventh inventions.

The Gunn diode according to the ninth invention is so arranged that a third electrode is formed on a rear surface of the semiconductor substrate, in that the third electrode and first electrode are used for impressing voltage on the active layer, and in that the second electrode is made to be for the spacers in the first to eighth inventions.

The fabricating method for a Gunn diode according to the tenth invention is so arranged that it comprises a first step of sequentially laminating and forming a first semiconductor layer which serves as a first contact layer, an active layer, and a second semiconductor layer which serves as a second contact layer onto a semiconductor substrate, a second step of forming first and second electrodes of specified shapes onto the second contact layer, and a third step of removing the second semiconductor layer and the active layer through dry etching wherein the first and second electrodes are used as masks.

The fabricating method for a Gunn diode according to the eleventh invention is so arranged that the second step includes a step of forming, after forming an underlying electrode layer for the first and second electrodes of specified shapes, conductive protrusions on the underlying electrode layer such that their heights are substantially identical with each other in the tenth invention.

The fabricating method for a Gunn diode according to the twelfth invention is so arranged that the semiconductor substrate, the first semiconductor layer, the active layer and the second semiconductor layer are formed of compound semiconductors such as gallium arsenide or indium phosphide in the tenth or eleventh inventions.

The structure for assembly of the Gunn diode of the thirteenth invention is so arranged that a surface ground electrode is formed on a surface of a microstrip substrate obtained by forming a signal electrode on a surface of a semi-insulating plate substrate and a ground electrode on a rear surface thereof, wherein the surface ground electrode is connected to the ground electrode on the rear surface through a via hole, and that the first and second electrodes of the Gunn diode of the first to eighth inventions are respectively connected and mounted to the signal electrode and the surface ground electrode.

The structure for assembly of the Gunn diode of the fourteenth invention is so arranged that the first and second electrodes of the Gunn diode of the first to eighth inventions are respectively connected and mounted to a signal electrode and a pair of ground electrodes of a coplanar waveguide obtained by forming the signal electrode and the pair of ground electrodes on a surface of a semi-insulating plate substrate.

The structure for assembly of the Gunn diode of the fifteenth invention is so arranged that one end of the signal electrode is open at length L from a portion to which the first electrode of the Gunn diode is connected, wherein a first electrode portion of the length L acts as a resonator and wherein an oscillating frequency is determined by the length L.

The structure for assembly of the Gunn diode of the sixteenth invention is so arranged that fourth and fifth electrodes are formed at a heat sink made of an insulating substrate, wherein the first electrode of the Gunn diode of the ninth invention is directly connected and mounted to the fourth electrode of the heat sink and the second electrode of the Gunn diode to the fifth electrode of the heat sink.

The structure for assembly of the Gunn diode of the seventeenth invention is so arranged that a hole is formed on a microstrip substrate obtained by forming a signal electrode on a surface of a semi-insulating plate substrate and a ground electrode which concurrently acts as a heat sink on a rear surface thereof, the hole extending from the surface to the ground electrode on the rear surface, wherein the fifth electrode of the heat sink of the sixteenth invention is connected to the ground electrode and wherein the third electrode of the Gunn diode of the sixteenth invention is connected to the signal electrode of the microstrip line through a conductive line within the hole.

The structure for assembly of the Gunn diode of the eighteenth invention is so arranged that an oscillating circuit, which oscillates at a specified frequency, is arranged of the signal electrode, the ground electrode and the Gunn diode, or by further adding a dielectric resonator thereto, in the thirteenth to seventeenth inventions.

The structure for assembly of the Gunn diode of the nineteenth invention is so arranged that a portion of the signal electrode that functions as an electrode of the oscillating circuit is at least partially covered by a plate substrate of conductive material, and in that the conductive portion of the plate substrate is connected to the ground electrode in the eighteenth invention.

The structure for assembly of the Gunn diode of the twentieth invention is so arranged that a resistivity of the plate substrate of the microstrip line or coplanar waveguide is not less than $10^6$ Ωcm, and a thermal conductivity is not less than 140 W/mK in the thirteenth to nineteenth inventions.

The structure for assembly of the Gunn diode of the twenty-first invention is so arranged that the plate substrate of the microstrip line or the coplanar waveguide is made of at least one of AlN, Si, SiC or diamond in the thirteenth to twentieth inventions.

The NRD guide Gunn oscillator of the twenty-second invention is obtained by disposing two parallel plates of metal at a distance that is not more than half a free space wavelength of an used frequency and combining a NRD guide circuit pinching and holding a dielectric strip line between the parallel plates and a Gunn diode, wherein the NRD guide Gunn oscillator comprises a plate substrate of insulating or semi-insulating material on which surface there are formed a signal electrode connected to a signal line and a ground electrode insulated with respect to the signal electrode, a Gunn diode being formed with an anode electrode and a cathode electrode on a same plane wherein one of the electrodes is connected to the signal electrode of the plate substrate and the other one is connected to the ground electrode, and a heat sink for supporting a rear surface of the plate substrate with respect to the other parallel plate, wherein a tip of the signal line of the plate substrate is electromagnetically combined to the dielectric strip line.

In the twenty-third invention, the plate substrate to which the Gunn diode is connected and mounted is parallel with respect to the parallel plate, and the signal line is electromagnetically combined thereto in a vertical direction with respect to the dielectric strip line in the twenty-second invention.

In the twenty-fourth invention, the plate substrate to which the Gunn diode is connected and mounted is parallel with respect to the parallel plate, a progressing direction of electromagnetic waves of the signal line is identical with a progressing direction of electromagnetic waves of the dielectric strip line, and the signal line is electromagnetically combined to a base end portion of the dielectric strip line in the twenty-second invention.

In the twenty-fifth invention, a posture of the parallel substrate to which the Gunn diode is connected and mounted is changed from a parallel one to a vertical one with respect to the parallel plate in the twenty-third or twenty-fourth invention.

In the twenty-sixth invention, the signal line is a suspended microstrip line, microstrip waveguide or coplanar line in the twenty-second to twenty-fifth inventions.

In the twenty-seventh invention, the parallel substrate comprises an electrode for grounding on a rear surface thereof, and the electrode for grounding is connected to the ground electrode through a via hole in the twenty-second to twenty-sixth invention.

The NRD guide Gunn oscillator of the twenty-eighth invention is obtained by disposing two parallel plates of metal at a distance that is not more than half a free space wavelength of an used frequency and combining a NRD guide circuit pinching and holding a dielectric strip line between the parallel plates and a Gunn diode, wherein the NRD guide Gunn oscillator comprises a plate substrate of insulating or semi-insulating material on which surface there are formed two signal electrodes connected to both ends of a signal line and a ground electrode insulated with respect to the respective signal electrodes, two Gunn diodes being respectively formed with an anode electrode and a cathode electrode on a same plane wherein one of the electrodes is connected to the signal electrodes of the plate substrate and the other one is connected to the ground electrode, and a heat sink for supplying a rear surface of the plate substrate with respect to the other parallel plate, wherein a substantially central portion of the signal line of the plate substrate is electromagnetically combined to the dielectric strip line.

In the twenty-ninth invention, a length of the signal line is set to be substantially half of a guide wave length of the signal line or an integer multiple thereof in the twenty-eighth invention.

In the thirtieth invention, the plate substrate to which the Gunn diodes are connected and mounted is vertical with respect to the parallel plate, and the substantially central portion of the signal line is electromagnetically combined with an end portion of the dielectric strip (line) in the twenty-eighth or twenty-ninth inventions.

In the thirty-first invention, a posture of the plate substrate to which the Gunn diodes are connected and mounted is changed from a vertical one to a parallel one with respect to the parallel plate in the thirtieth invention.

In the thirty-second invention, the signal line is a suspended microstrip line, microstrip line or coplanar line in the twenty-eighth to thirty-first inventions.

In the thirty-third invention, the plate substrate comprises an electrode for grounding on a rear surface thereof, and the electrode for grounding is connected to the ground electrode through a via hole in the twenty-eighth to thirty-second inventions.

BRIEF EXPLANATION OF THE DRAWINGS

FIGS. 1(a) and 1(b) are views showing a Gunn diode element according to a first embodiment of the present invention, wherein FIG. 1(a) is a top view and FIG. 1(b) a sectional view;

FIGS. 14(a) and 14(b) show a fourth embodiment in which the Gunn diode is implemented in a heat sink in a facing-down posture, wherein FIG. 14(a) is a top view of the heat sink and FIG. 14(b) a sectional view of the assembled condition;

FIGS. 16(a) and 16(b) are views showing a Gunn diode element of a fifth embodiment of the present invention, wherein FIG. 16(a) is a top view and FIG. 16(b) a sectional view;

FIG. 19 is an explanatory view of an assembling condition for a Gunn diode employed for measuring characteristics in FIG. 17 and FIG. 18;

DETAILED DESCRIPTION

EMBODIMENT 1

Figure 1A:
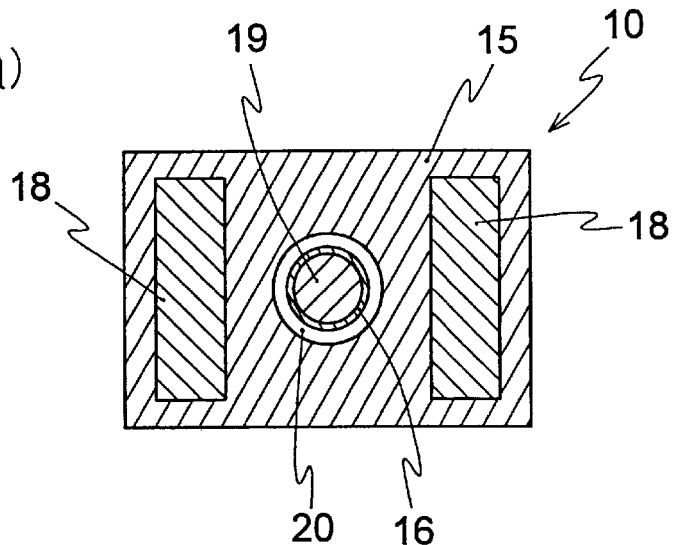
Figure 1B:
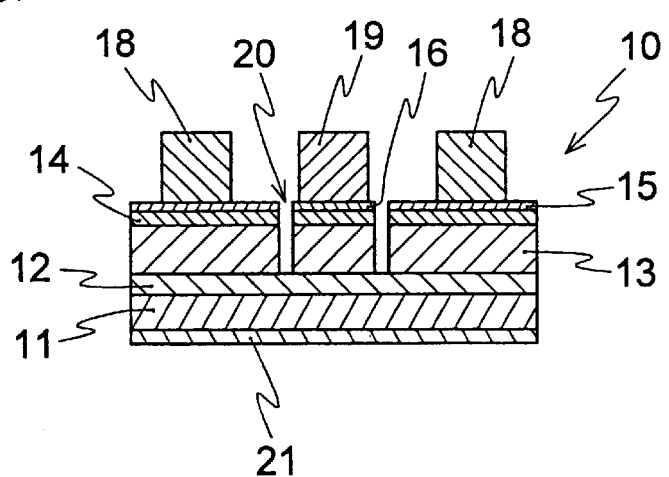

FIGS. 1(a) and 1(b) are diagrams showing a structure of a Gunn diode element 10 of gallium arsenide according to a first embodiment of the present invention, wherein FIG. 1(a) is a top view and FIG. 1(b) is a sectional view. FIG. 2 is a view showing fabrication steps.

Fabrication steps will now be explained along contents of FIG. 2. Onto a semiconductor substrate 11 of n-type gallium arsenide having an impurity concentration of 1 to $2\times10^{18}$ atom/cm$^3$, there are sequentially laminated through MBE method a first contact layer 12 of n-type gallium arsenide having an impurity concentration of $2\times10^{18}$ atom/cm$^3$ and a thickness of 1.5 μm, an active layer 13 of n-type gallium arsenide having an impurity concentration of $1.2\times10^{16}$ atom/cm$^3$ and a thickness of 1.6 μm, and a second contact layer 14 of n-type gallium arsenide having an impurity concentration of $1\times10^{18}$ atom/cm$^3$ and a thickness of 0.3 μm to obtain a semiconductor substrate with laminated lagers.

Onto the second contact layer 14, there is patterned a photoresist that is opened at regions on which a cathode electrode and an anode electrode are to be formed, and a metal film (underlying electrode layer) of AuGe, Ni and Au that is in ohmic contact with the second contact layer 14 is vapor-deposited thereon. After removing the photoresist, a heat treatment (sintering) is performed, and cathode electrode 15 and anode electrode 16 are formed on the second contact layer 14 in a separate manner (FIG. 2(a)). As shown in FIG. 1, the planar shape of the cathode electrode 15 is oblong and the planar shape of the anode electrode 16 is round, while these might alternatively be oval or substantially square.

Figure 2A:
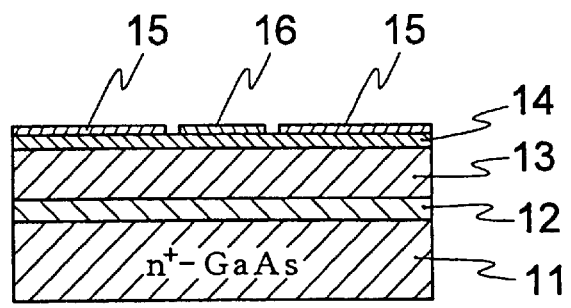
FIG. 2 is a view for explaining fabrication steps of the above Gunn diode element.
Figure 2B:
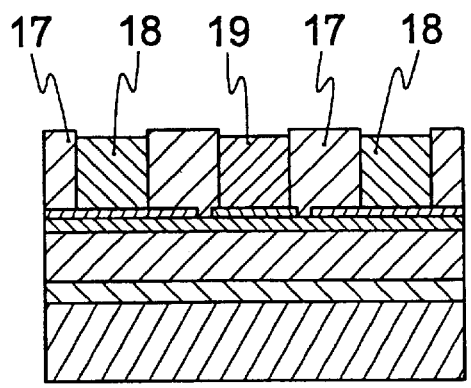

Next, photoresist 17 is patterned as to leave a part of the surfaces of the cathode electrode 15 and anode electrode 16 open, and bumps (electrodes) 18, 19 which are conductive protrusions of Au or the like are formed in the open portions through precipitation by electrolytic plating or non-electrolytic plating (FIG. 2(b)).

Figure 2C:
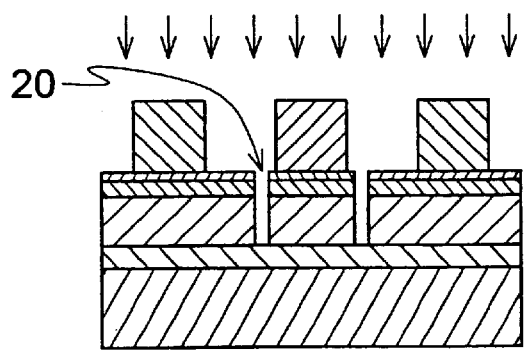
Figure 2D:
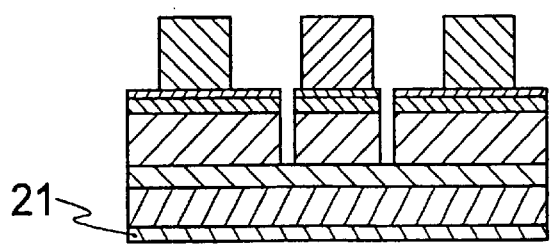

Next, after exposing the second contact layer 14 formed with the cathode electrode 15 and anode electrode 16 through removing the photoresist 17, the cathode electrode 15 and anode electrode 16 are used as masks when removing the second contact layer 14 and active layer 13 through dry etching such as reactive ion etching (RIE) employing chlorine gas or the like to form a substantially mesa-type or vertical concave portion 20 around the anode electrode 16 (FIG. 2(c)). In this manner, a targeted concave portion 20 can be accurately formed through etching in a vertical direction through self-alignment using the cathode electrode 15 and the anode electrode 16 as masks.

The area of the active layer 13 to which the anode electrode 16 which has been sub-divided by the concave portion 20 is connected is set to be an area (transverse cross section) with which a specified operating current of the Gunn diode can be obtained. That is, this area is set to be an area that can function as a Gunn diode. Further, an area of the active layer 13 to which the cathode electrode 15 is connected is set to be not less than ten times as large as an area of the active layer 13 to which the anode electrode 16 is connected, and the electric resistance of a semiconductor laminated portion below the cathode electrode 15 is made to be not more than 1/10 of the electric resistance of a semiconductor laminated portion below the anode electrode 16. With these arrangements, this portion is not made to function as a Gunn diode but to function as a resistance of substantially low value, and the cathode electrode 15 is substantially connected to the first contact layer 12. The area ratio of the active layer 13 needs to be not less than 10, and preferably not less than 100, since a ratio of below 10 would not be effective but only results in a decreased conversion efficiency.

It should be noted that while the cutting depth of the concave portion 20 is set to be a depth that is obtained by totally removing the active layer 13, but it might alternatively be arranged that a part of the active layer 13 remains or that the cutting reaches to some extend into the first contact layer 12.

It should be noted that while the area of the active layer below the cathode electrode has been set to be larger than that of the anode electrode, it might be employed an reversed arrangement in which the area of the active layer below the anode electrode is larger than that of the cathode electrode. That is, the anode electrode and cathode electrode are mutally interchangeable. While elimination of concentration gradients in the impurity concentration of the active layer 13 enables the interchange between the anode 19 and cathode 18, in the presence of concentration gradients, the electrode of lower concentration is set to be the cathode electrode and the electrode of higher concentration is set to be the anode electrode.

Next, the rear surface of the semiconductor substrate 11 is ground for lamination in accordance with the ordinary fabricating processes for Gunn diodes such that the thickness of the whole Gunn diode becomes approximately 60 μm. Thereafter, if required, a metal film 21 of AuGe, Ni, Au, Ti, Pt or Au that is in ohmic contact with the semiconductor substrate 11 is vapor-deposited onto the rear surface of the semiconductor substrate 11, and a heat treatment is performed (FIG. 2(d)).

While the metal film that is formed on the rear surface of the semiconductor substrate 11 is not necessarily required, it might function as a cathode electrode substituting the cathode electrode 15 in the case of an structure for assembly (FIG. 15) as will be described later is taken. In such a case, there will be no restrictions to set the area ratio between the cathode electrode 15 and the anode electrode 16 to be not more than 1/10 as it has been described above.

As explained so far, the Gunn diode 10 according to the present embodiment is so arranged that it comprises, in a separate manner, a portion which functions as a Gunn diode and a low resistance layer portion which functions as a voltage impressing path from the exterior to the first contact layer 12 of the Gunn diode portion through the provision of the concave portion 20 in the semiconductor laminated portion to surround the anode electrode 16. With this arrangement, both the cathode electrode 15 and anode electrode 16 can be formed on the upper surface of the second contact layer 14. In other words, the cathode electrode 15 and the anode electrode 16 can be arranged on a same surface, whereby great advantages can be obtained in terms of assembly or heat dissipation as will be described later.

Since etching for defining a region for determining an operational current (a portion that functions as a Gunn diode) is performed through dry etching in a self-alignment method by utilizing electrodes formed above the region as masks, variations in manufacture can be decreased than compared to conventional chemical wet etching, and the yield (factor of good products) can be made high.

Figure 3A:
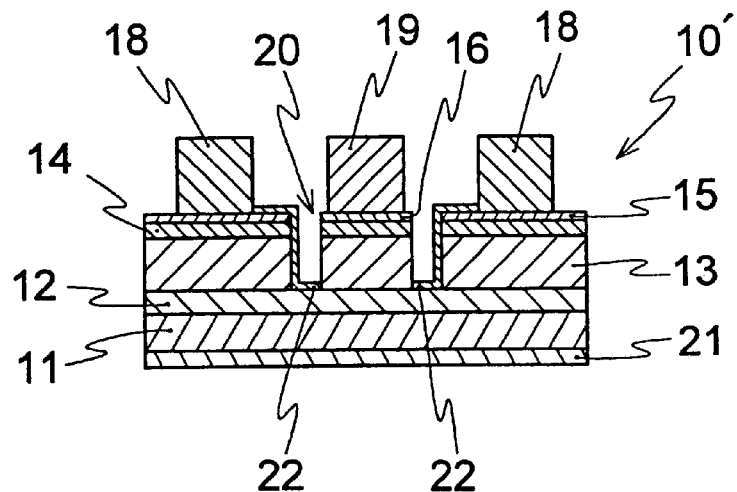
FIG. 3(a) and FIG. 3(b) are sectional views showing an alternative example of the above Gunn diode element.

FIG. 3(a) is a view showing an alternative example 10' of the Gunn diode element 10 shown in FIG. 1(b), which is so arranged that a conductive film 22 is provided within the concave portion 20 and that the first contact layer 12 and the cathode electrode 15 are shorted. With this arrangement, influences of parasitic resistance can be prevented in case the parasitic resistance between the cathode electrode 15 and the first contact layer 12 is large, and voltage impressed on the cathode electrode 15 can be transmitted to the first contact layer 12 with hardly no losses.

Figure 3B:
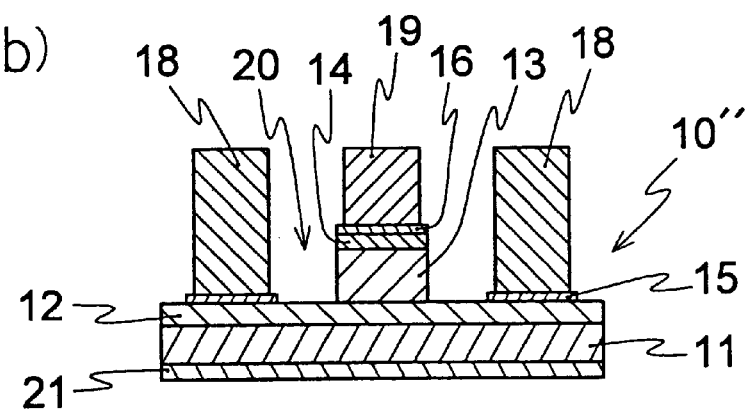

By further developing the idea of this Gunn diode element 10', a Gunn diode element 10" as shown in FIG. 3(b) can be provided wherein the cathode electrode 15 is directly formed on the upper surface of the first contact layer 12, bumps 18 are formed on the surface thereof, and the remaining arrangements are identical with those as shown in FIG. 1(b), whereby the upper surfaces of the bumps 18, 19 are aligned at identical height levels. In the Gunn diodes 10', 10'', there will be no restrictions to set the area ratio between the cathode electrode 15 and the anode electrode 16 to be not more than $\frac{1}{10}$ as it has been described above.

EMBODIMENT 2

Figure 4:
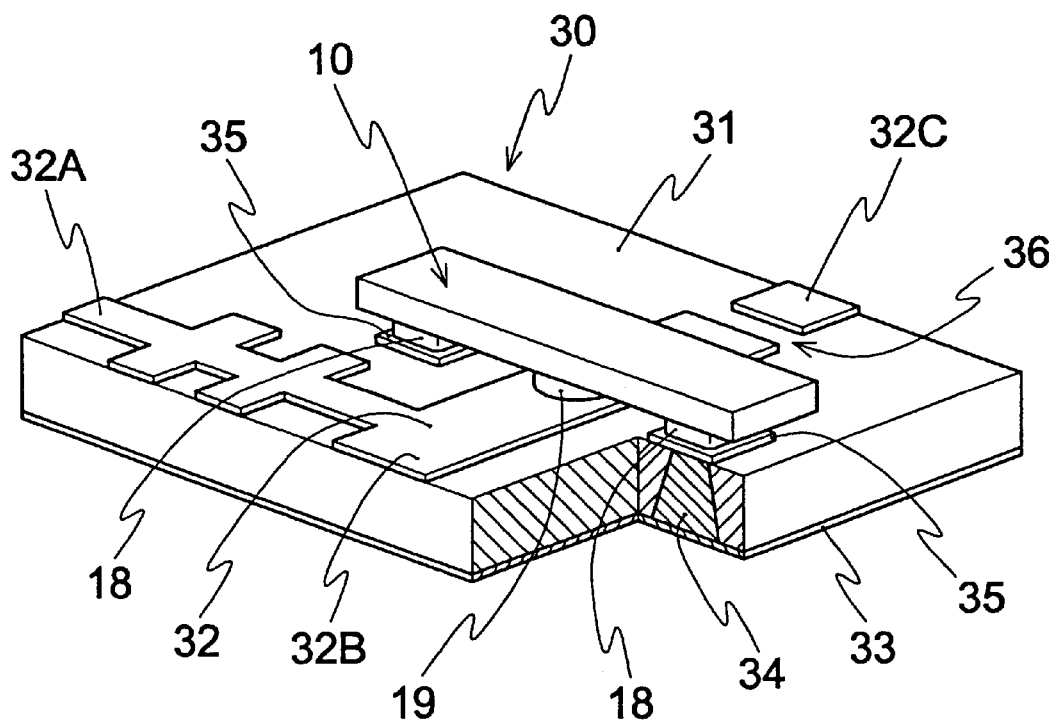
FIG. 4 is a cross view of a second embodiment in which the above Gunn diode element is assembled in a microstrip substrate.

FIG. 4 is a view showing one example of an arrangement in which a Gunn diode element 10 is assembled on a planar circuit substrate forming a microstrip line 30 to form an oscillator. A signal electrode 32 is formed on a plate substrate 31 of semi-insulating material such as AlN (aluminum nitride), Si(silicone), SiC (silicone carbide) or diamond having a favorable resistivity of not less than $10^6$ Ω·cm and a thermal conductivity of not less than 140 W/mK, and the rear surface thereof is formed a ground electrode 33. 34 denotes via holes filled with tungsten, that connect the ground electrode 33 on the rear surface and surface ground electrode 35 formed on the upper surface.

A bump 19 of an anode electrode of the Gunn diode element 10 is connected to the signal electrode 32, and bumps 18 of cathode electrodes are connected to the ground electrode 35. 32A denotes an electrode of a bias portion for supplying power source voltage to the Gunn diode element 10, 32B an electrode for making up an resonator formed by the microstrip line including the Gunn diode element 10, 36 a condenser portion for performing direct-current cut, and 32C an electrode of a signal output portion formed by the microstrip line.

In this structure for assembly, the Gunn diode element 10 is set in a facing-down posture and the bumps 18, 19 are directly connected to the electrodes 35, 32 without employing a gold ribbon. With this arrangement, generation of parasitic inductance owing to connection through the gold ribbon can be eliminated, and an oscillator with hardly no variations in characteristics can be realized.

Since heat generated in the Gunn diode element 10 is dissipated, via the bumps 18, 19, to the substrate 31 which also functions as a heat sink, heat dissipating effects can be improved. Further, since the bumps 18 of the cathode electrode are positioned on both sides of the bump 19 in such an assembly of the Gunn diode element 10, it can be prevented that excessive mechanical load is applied to the anode electrode.

Figure 5:
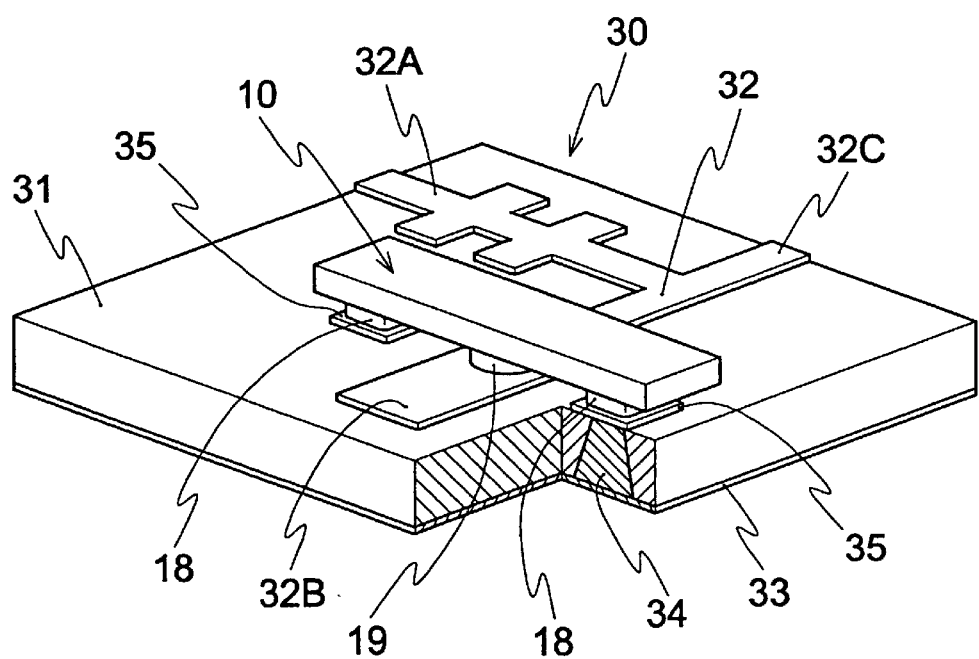
FIG. 5 is a cross view of an alternative example of the structure for assembly of FIG. 4.

In FIG. 5, the electrode 32A of the bias portion is provided on the side of the electrode 32C of the signal output portion of the oscillator as shown in FIG. 4. The plane of the plate substrate 31 arranged as in FIG. 5 would look like FIG. 6(a), and by adjusting length L of the electrodes 32B which is open at its tip, the oscillation frequency and output power can be set. FIG. 7 shows the oscillating characteristics of the circuit shown in FIGS. 6(a), (b), wherein the characteristic impedance of the electrode 32C is set to 50Ω, and the characteristic impedance of the electrode 32B to 35Ω.

Figure 8:
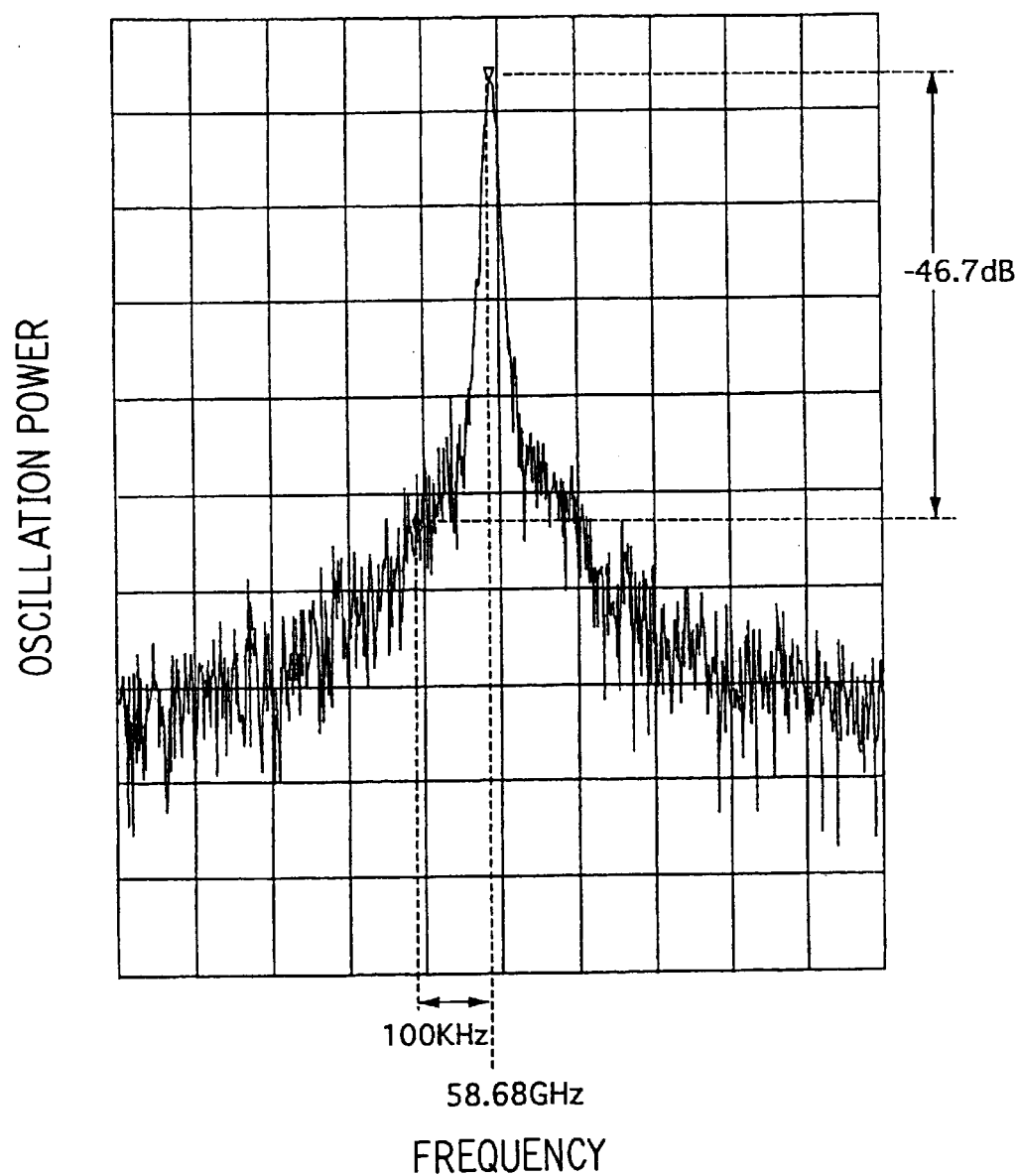
FIG. 8 shows spectrum of the oscillation in case the Gunn diode element is assembled in direction (a) in FIG. 6.
Figure 9:
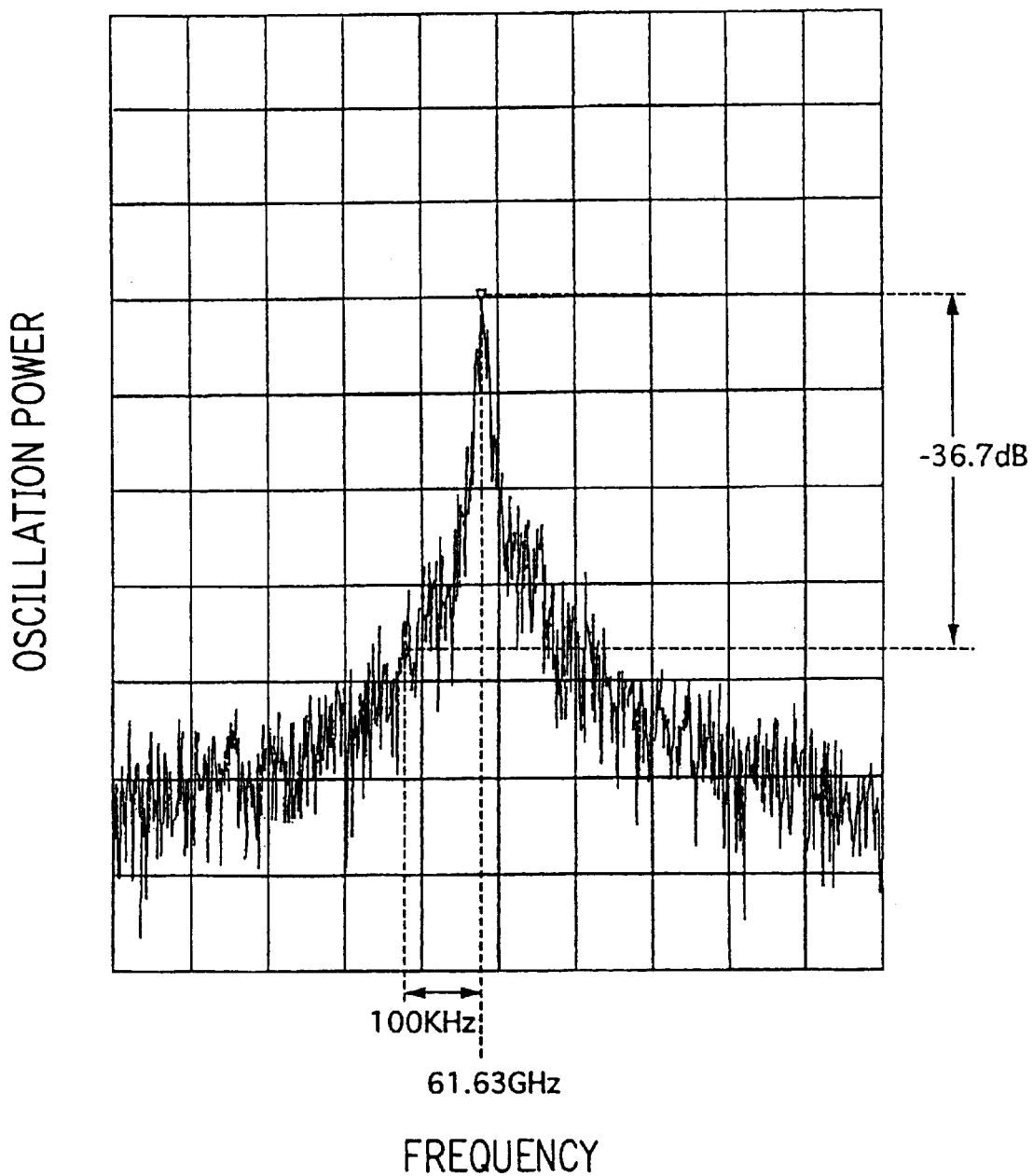
FIG. 9 shows spectrum of the oscillation in case the Gunn diode element is implemented in direction (b) in FIG. 6.

FIG. 8 shows the oscillating spectrum at a center frequency of 58.68 GHz, and it can be seen that the phase noise is −85 dBc/Hz at 100 KHz off carrier, this value being more favorable than compared to those of Gunn diode oscillators employing a waveguide cavity. While the value is −46.7 dBc in FIG. 8, it becomes −85 dBc/Hz from the following equation −47.6 dB+2.5 dB−10 log (1 Hz/(10 Hz×1.2))=−85 dB It should be noted that in case the oscillator is arranged as shown in FIG. 6(b) wherein the bump 19 of the anode electrode in the center of the Gunn diode element 10 is connected to surface ground electrodes 35' that are connected to the ground electrode on the rear surface through the via holes, and one of the bumps 18 of the cathode electrodes on both sides is connected to electrode 32B' of the resonator and the other one to the electrodes 32C for output, the phase noise is −75 dBc/Hz at 100 KHz off carrier with a center frequency of 61.63 GHz as shown in FIG. 9 (while it should be again noted this value is obtained from the above equation based on the value −36.7 dBc/Hz in FIG. 9). It can thus be understood that this arrangement is inferior to the connecting structure as shown in FIG. 6(a) by 10 dB.

Figure 6A:
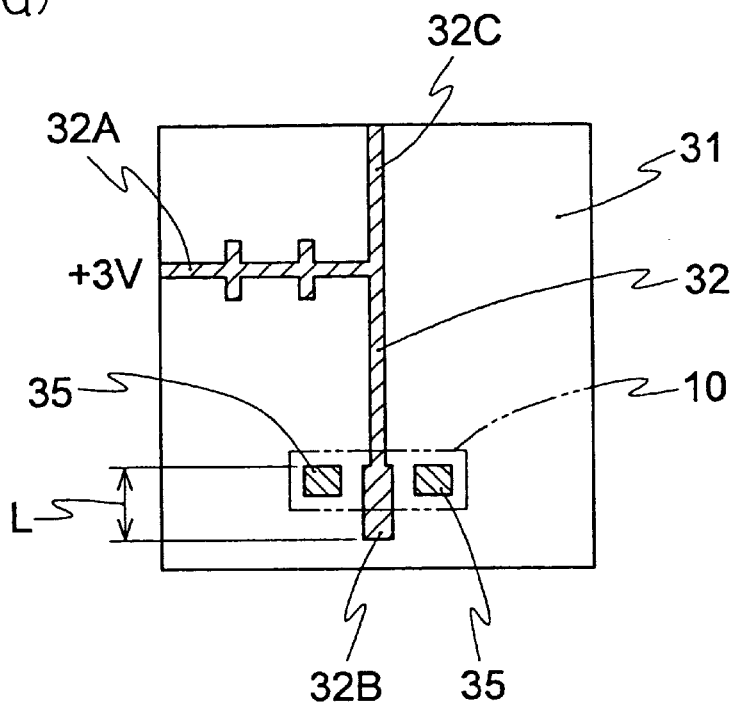
FIG. 6(a) and FIG. 6(b) are top views of the structure for assembly of the Gunn diode element.
Figure 6B:
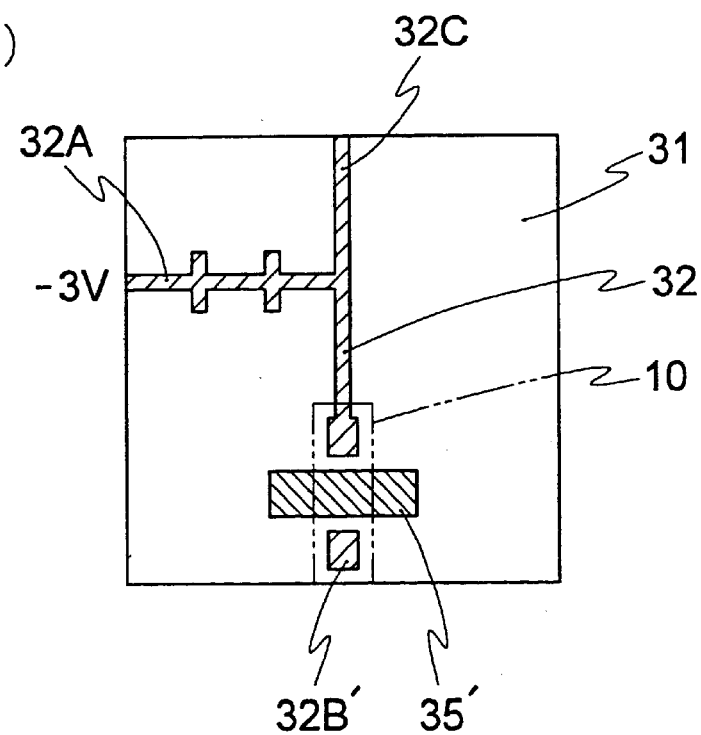
Figure 7:
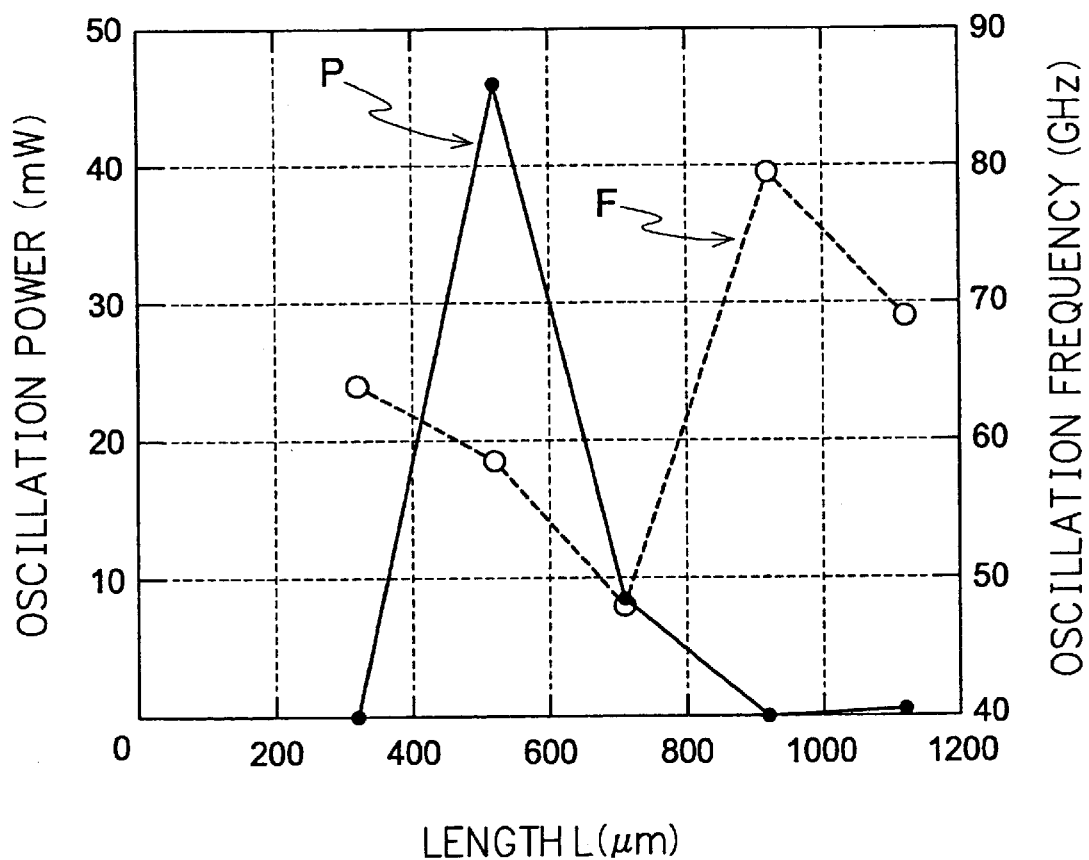
FIG. 7 shows variation of oscillation frequencies and RF power as a function of length L of electrode 32B in case the Gunn diode element is assembled as an oscillator.

This is considered to be due to the fact that the semiconductor substrate 11 of the Gunn diode element 10 is grounded via the bumps 18 or surface ground electrode 35 in the structure for connection of FIG. 6(a), and this semiconductor substrate 11 functioning as a shielding plate, decrease in Q owing to radiation loss of the oscillator can be restricted whereby the phase noise is improved.

Figure 10:
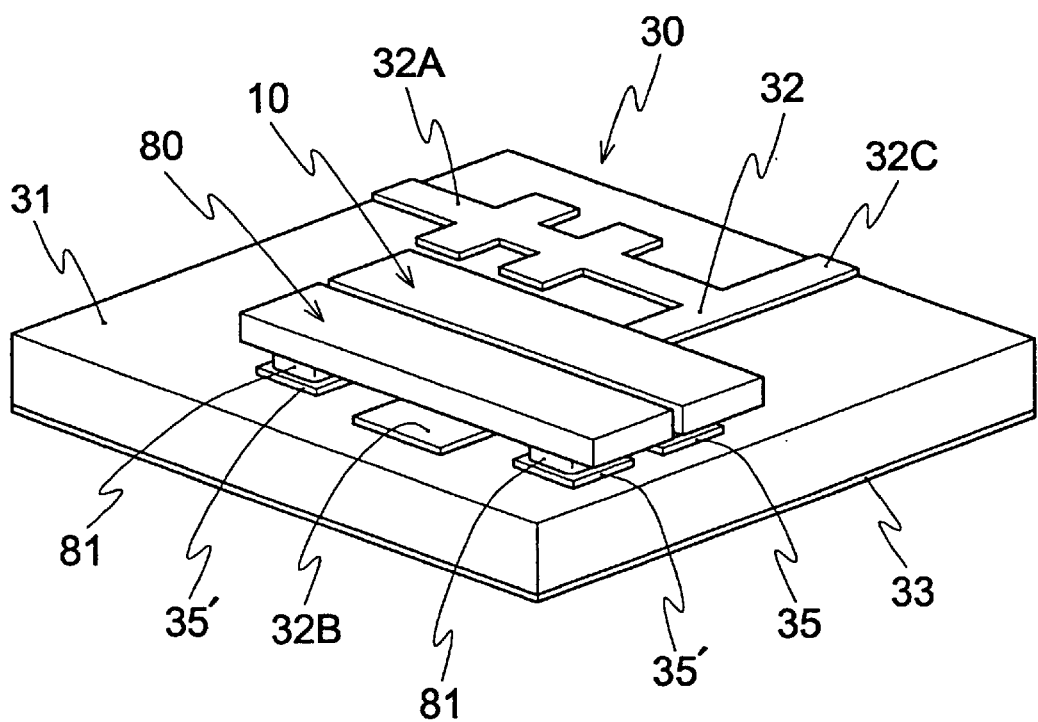
FIG. 10 is a cross view in which a plate substrate is additionally assembled to the structure for assembly of FIG. 5.

In FIG. 10, additional surface ground electrodes 35' are formed along both sides of the electrodes 32B to be in alignment with surface ground electrodes 35 in the oscillator as shown in FIG. 5, wherein the additional electrodes are connected to the ground electrode 33 on the rear surface through via holes (not shown) and wherein a conductive plate substrate 80 has been provided to cover the electrode 32B making up the oscillator. This plate substrate 80 comprises bumps 81 for connection with the surface ground electrodes 35'.

In the arrangement as shown in FIG. 10, the conductive plate substrate 80 is grounded via the bumps 81 and the surface ground electrodes 35', whereby the radiation loss in the resonator can be further restricted to realize a resonator of high Q. The substrate of the plate substrate 80 itself maybe of semi-insulating material as long as at least a part thereof is covered by metallic electrodes. A similarly high Q can be achieved by substituting the plate substrate 80 by a Gunn diode element 10 having a larger chip size and by covering the electrodes 32B by the semiconductor substrate 11 of the Gunn diode element 10. The surface ground electrodes 35' may be formed by extending the surface ground electrodes 35.

EMBODIMENT 3

Figure 11:
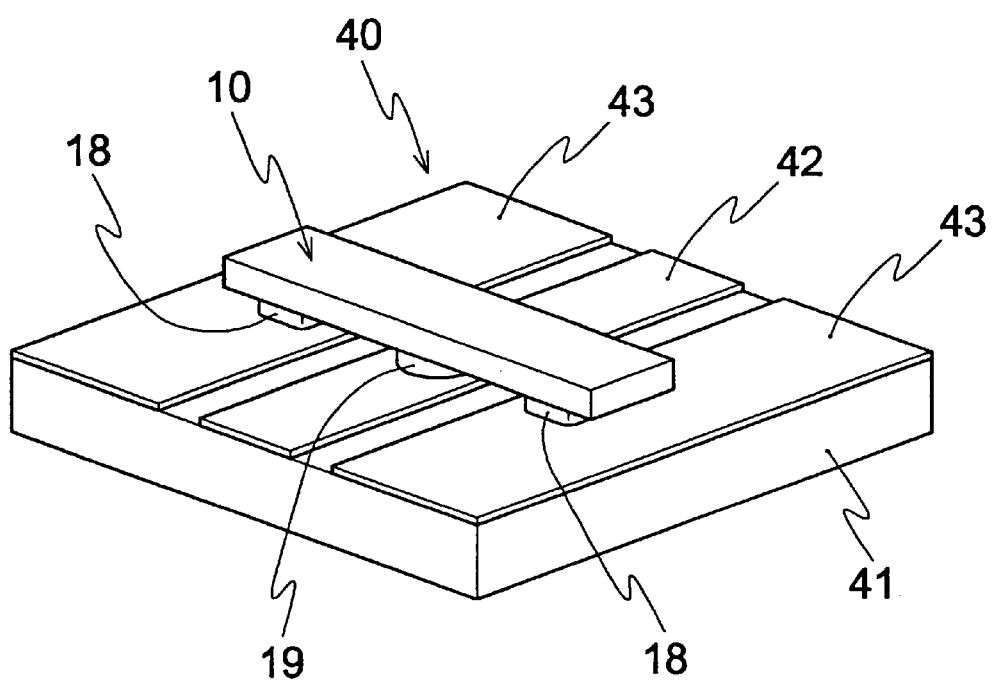
FIG. 11 is a cross view of a third embodiment in which the above Gunn diode element is implemented in a coplanar waveguide.

FIG. 11 is a view showing an example of an arrangement in which a Gunn diode element 10 is implemented in a circuit substrate making up a coplanar waveguide 40. 41 denotes a semi-insulating plate substrate made of the same material as the above described substrate 31, on which surface there are formed a signal electrode 42 forming a signal line and a pair of grounding electrodes 43 as to pinch the same between.

Here, bump 19 of the anode electrode of the Gunn diode element 10 is directly connected to the signal electrode 42 in the center, and bumps 18 of the cathode electrodes are directly connected to ground electrodes 43 on both sides. With this arrangement, applied voltage between the signal electrode 42 and ground electrodes 43 is applied between the anode electrode and cathode electrodes of the Gunn diode element 10, whereby oscillation can be generated. This structure for assembly as shown in FIG. 11 presents functions and effects similar to the structures for assembly as shown in FIG. 4, FIG. 5 and FIG. 10 such as stabilizing characteristics, improving heat dissipating effects, or protecting the anode electrode.

Figure 12:
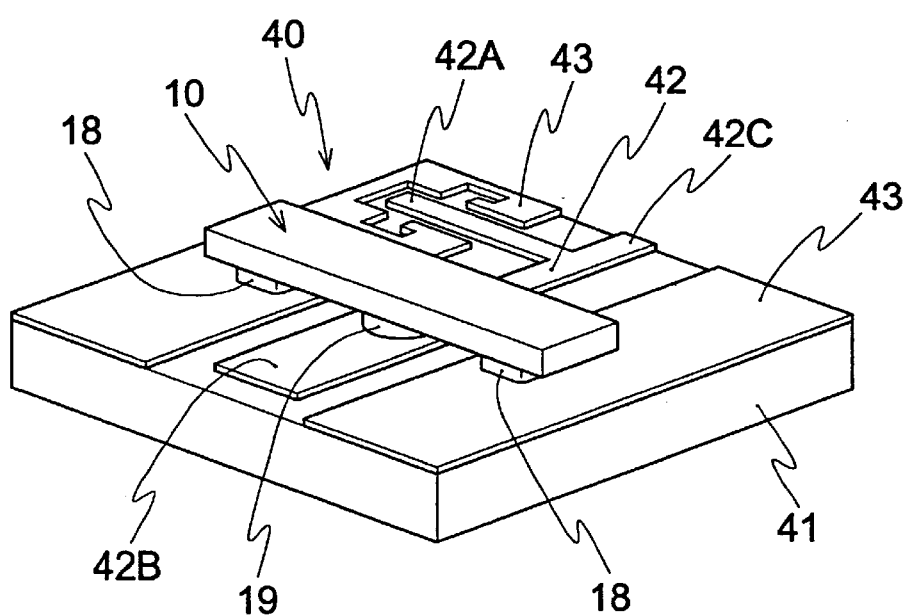
FIG. 12 is a cross view of an alternative example of the structure for assembly of FIG. 11.

In FIG. 12, electrode 42A functioning as a bias portion for applying +3.0 V is formed in succession to signal line 42. A choke is formed by the ground electrode 43 as to surround the electrode 42A in order to ease influences to the power source. The oscillation frequency and output power can similarly be set by adjusting the length from a portion of the Gunn diode element 10 of the electrode 42B making up the oscillator up to its open tip. 42C denotes an electrode of a signal output portion.

Figure 13:
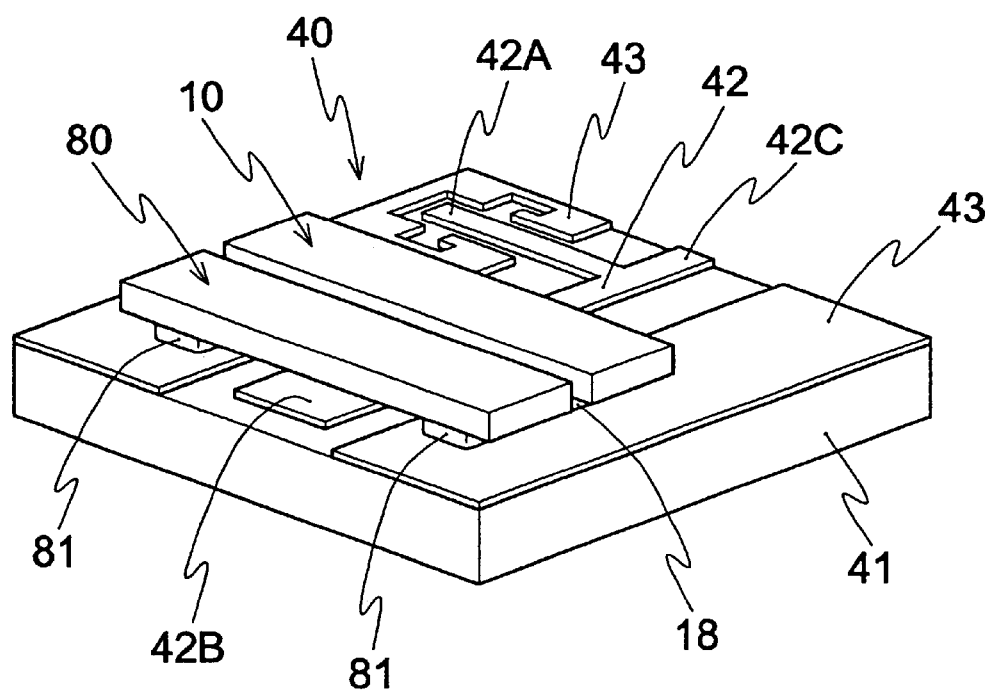
FIG. 13 is a cross view in which a plate substrate is additionally assembled to the structure for assembly of FIG. 12.

FIG. 13 is based on the same idea as that of the above described FIG. 10, wherein an upper surface of the electrode 42B making up the oscillator is covered by conductive plate substrate 80, and bumps 81 on both sides of the plate substrate 80 are connected to grounding electric conductors 43. This arrangement makes it possible to restrict radiation losses in the resonator and to realize a resonator having a high Q.

EMBODIMENT 4

Figure 14A:
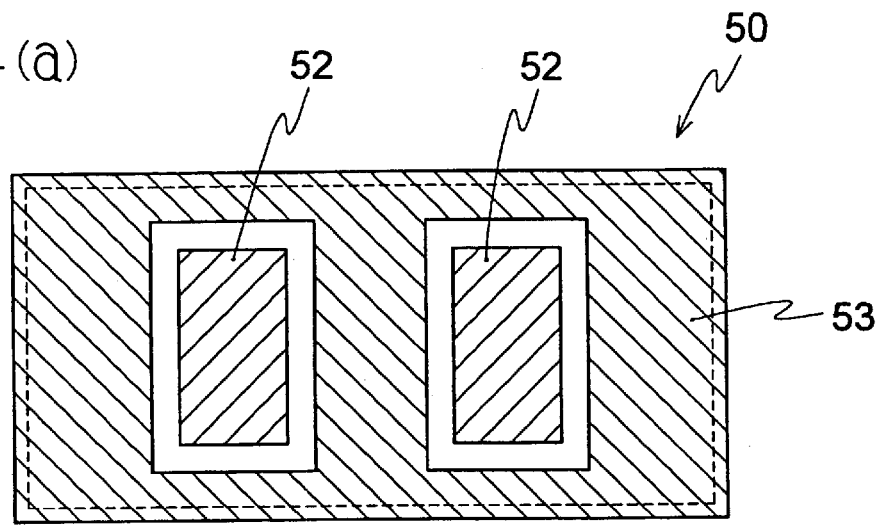
Figure 14B:
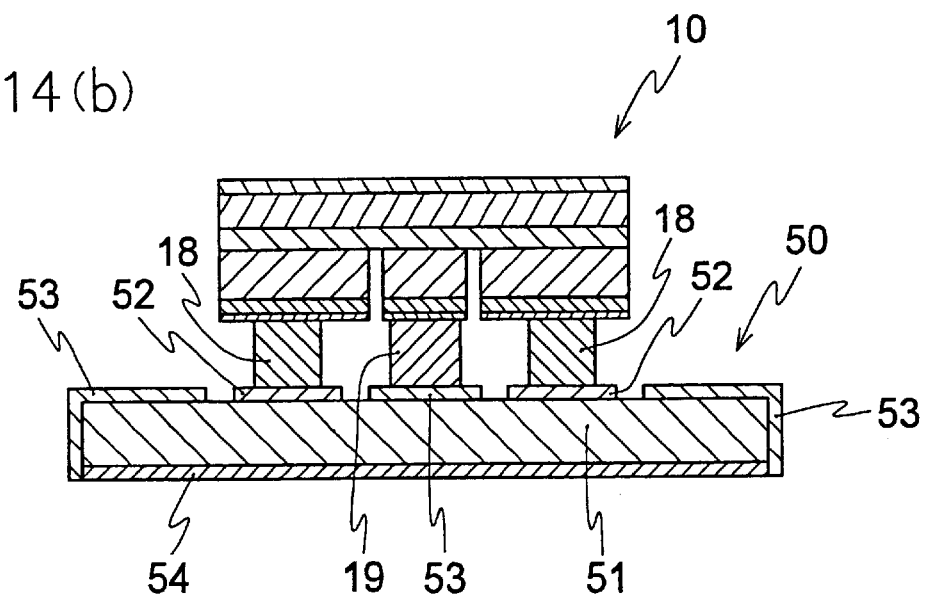

FIG. 14 is a view showing a heat dissipating structure of Gunn diode element 10. 50 denotes a heat sink employing a diamond substrate 51 on which there are formed electrodes 52 to which bumps 18 of cathode electrodes of the Gunn diode element 10 are connected, and electrode 53 to which a bump 19 of anode cathode 19 is connected. Electrodes 52 are separated from the electrode 53 in an independent manner and the electrodes 53 are connected to the ground electrode 54.

While heat is generated at the semiconductor laminated portion of the Gunn diode element 10 that corresponds to the anode electrode functioning as the Gunn diode, this heat is transferred to the heat sink 50 via the bumps 18, 19 (mainly bumps 19) for performing cooling.

Figure 15:
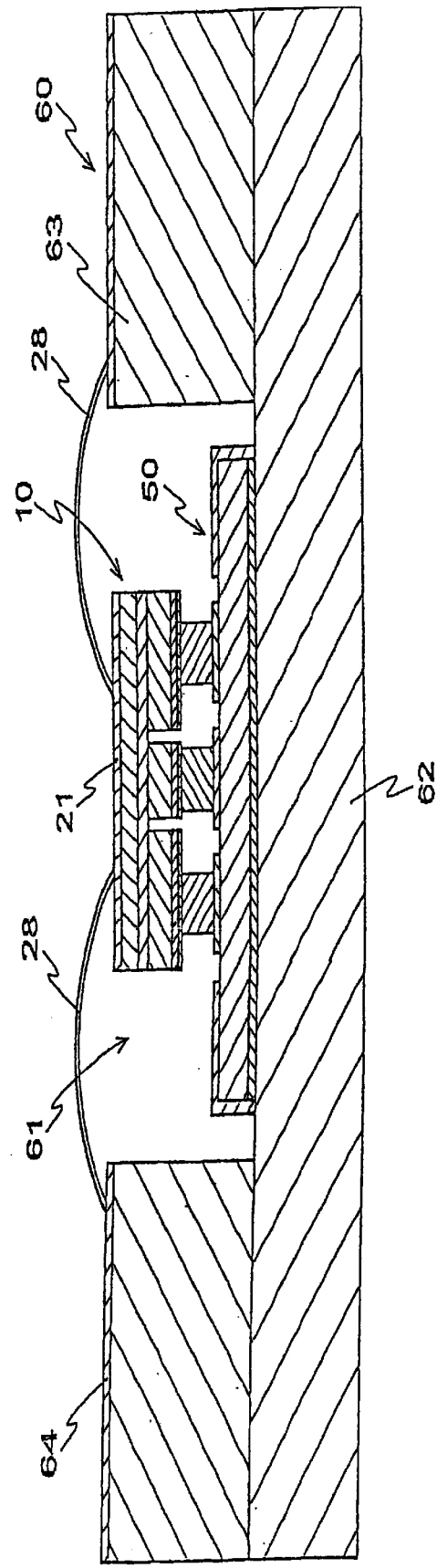
FIG. 15 is a sectional view showing a condition in which the Gunn diode element assembled in the heat sink as shown in FIG. 14 is further assembled in a microstrip line.

FIG. 15 is a view showing the structure for assembly of the Gunn diode element 10 of FIG. 14 assembled into microstrip line 60. The heat sink 50 implemented with the Gunn diode element 10 is adhered, within hole 61 formed in the microstrip 60, to a ground electrode 62 which concurrently serves as a heat dissipating base, and a signal electrode 64 on the plate substrate 63 made of alumina and a cathode electrode 21 on the rear surface of the Gunn diode element 10 are connected through gold ribbon 28.

In this arrangement, applied voltage between the signal electrodes 64 and the ground electrodes 62 is applied between the cathode electrode 21 and anode electrode 16 through the gold ribbon 28 and electrodes 53, 54 of the heat sink 50. At this time, the bumps 18 of the cathode electrodes 15 function as spacers for maintaining the facing-down posture from both sides and do not function as a transmitting path for current. This arrangement is quite simple and enables a remarkable decrease in costs than compared to arrangements employing conventional pill-type packages 110.

EMBODIMENT 5

Figure 16A:
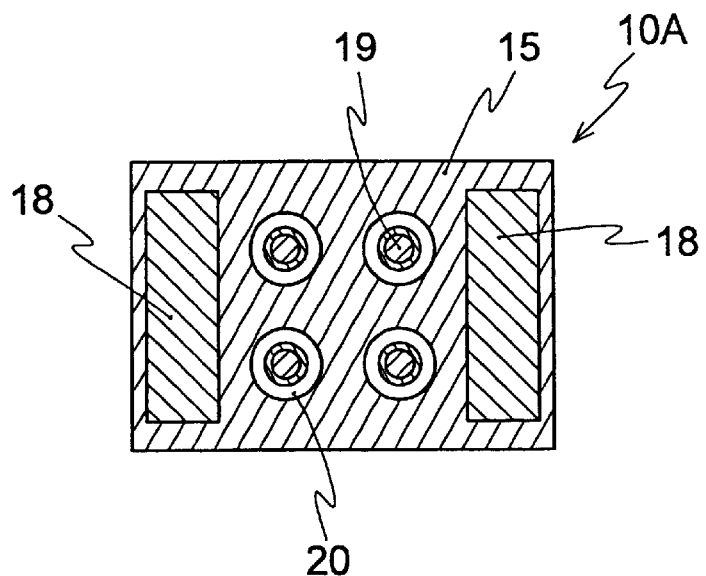
Figure 16B:
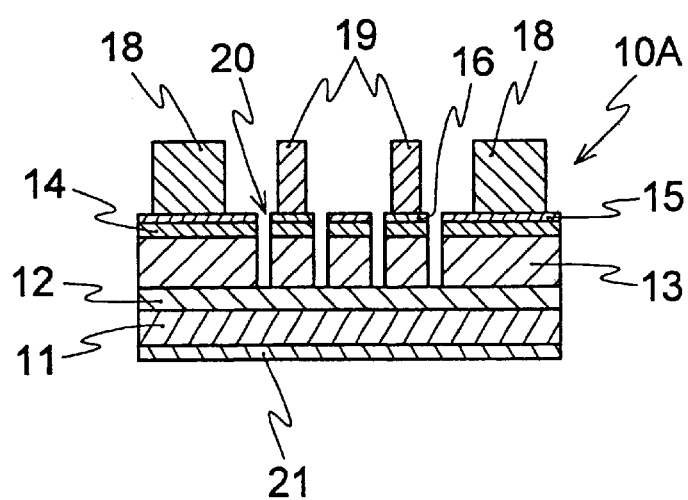

FIG. 16 is a view showing an arrangement of an alternative example of a Gunn diode element 10A, wherein (a) is a top view and (b) a sectional view. In this arrangement, four anode electrodes 16 are individually formed and four concave portions 20 corresponding thereto make up to four Gunn diode portions of mess-type structure. Since voltage is commonly applied to the individual Gunn diode portions of mesa-type structure, these are in parallel connected conditions during operation.

With this arrangement, the radius of the mesa-type structured portions can be made small and since the heat dissipating effect is remarkably higher than compared to a single Gunn diode portion of mesa-type structure which area is identical to a sum of areas of four Gunn diode portions of mesa-type structure, the conversion efficiency (ratio of input power to output power) or the output power is enabled to be remarkably high. It should be noted that the smaller the area of the mesa-type structured portion becomes, the weaker its strength becomes so that there may be a danger of destruction during the assembling stage. However, since the bumps 18 of the cathode electrodes are formed to surround them and which substantially receive the load, there is actually no danger of destruction. It should also be noted that the number of individual Gunn diode portions of mesa-type arrangement is not limited to four. The cross section of the plurality of Gunn diodes do not necessary be identical, neither are their sectional shapes (shapes of anode electrodes) limited to round shapes but may assume any arbitrary shape.

Figure 17:
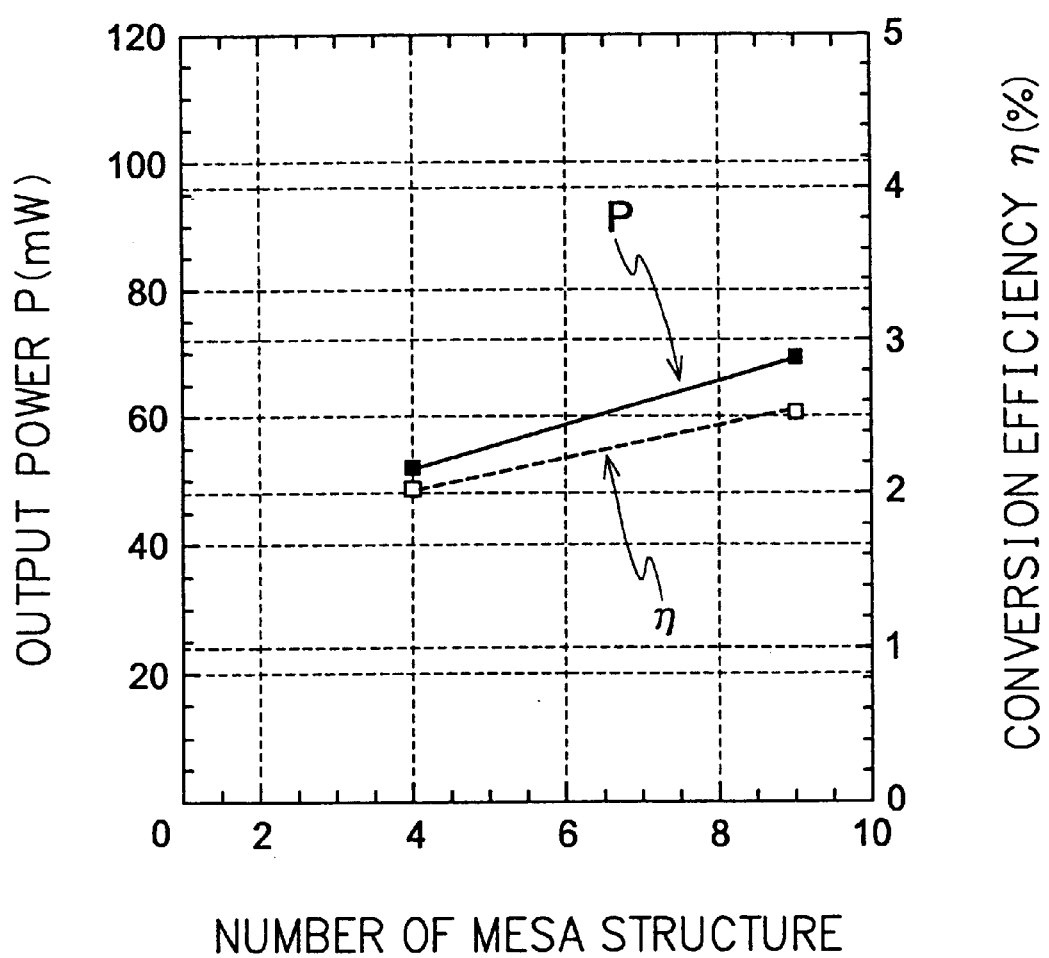
FIG. 17 is a diagram showing characteristics of output power and conversion efficiency corresponding to a number of mesa-type structured portions of a Gunn diode element of a specified sum of area.
Figure 18:
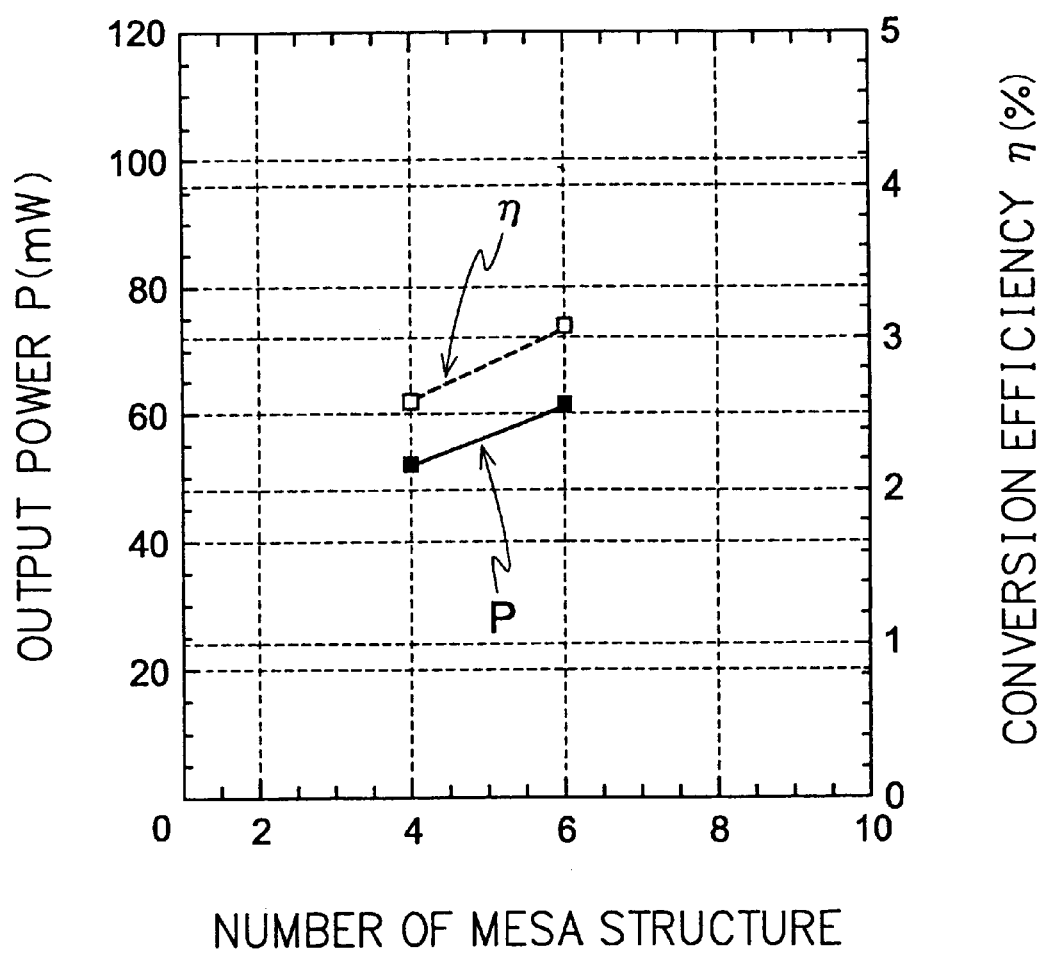
FIG. 18 is a diagram showing characteristics of output power and conversion efficiency corresponding to a number of mesa-type structured portions of a Gunn diode element of another specified sum of area.

FIG. 17 shows variation of conversion efficiency η (%) and output power P (mW) as a function of the number of Gunn diode portions of mesa-type structure. It can be understood that both the conversion efficiency as well as the output power are increased in case the number of Gunn diode portions of mesa-type structure are increased from four to nine without changing the sum of areas of the anode electrodes. FIG. 18 shows similar variation of conversion efficiency and output power in case the number of Gunn diode portions of mesa-type structure is changed from four to six with a different sum of areas of the anode electrodes, and it can be observed a similar tendency.

It should be noted that such measurements have been performed under a condition in which they were assembled in a waveguide as shown in FIG. 19. 70 denotes a waveguide, 71 a conductive basement (anode) provided in the waveguide 70, and 72 a solder for adhering an insulating substrate 73 onto the basement 71. In the Gunn diode element 10A having a plurality of anode electrodes, bumps 18 of the cathode electrodes are supported in a facing-down posture on the insulating substrate 73 via electrodes 74, and bump 19 of the anode electrode is connected to the basement 71 through electrode 75, via hole 76 formed in the insulating substrate 73 and the solder 72. A bias post 77 to which bias voltage is applied is inserted into the waveguide 70, and a lower end thereof is connected to electrode 21 on the rear surface of the Gunn diode element 10A through gold ribbon 78.

It should be noted that while the above explanations are based on an example in which gallium arsenide has been employed as semiconductors, similar effects can be achieved in case other compound semiconductors such as indium phosphide are used. Further, in case of arranging an oscillator by assembling the Gunn diode element to the above described microstrip line or coplanar waveguide, it is also possible to additionally provide a dielectric resonator.

EMBODIMENT 6

Figure 20A:
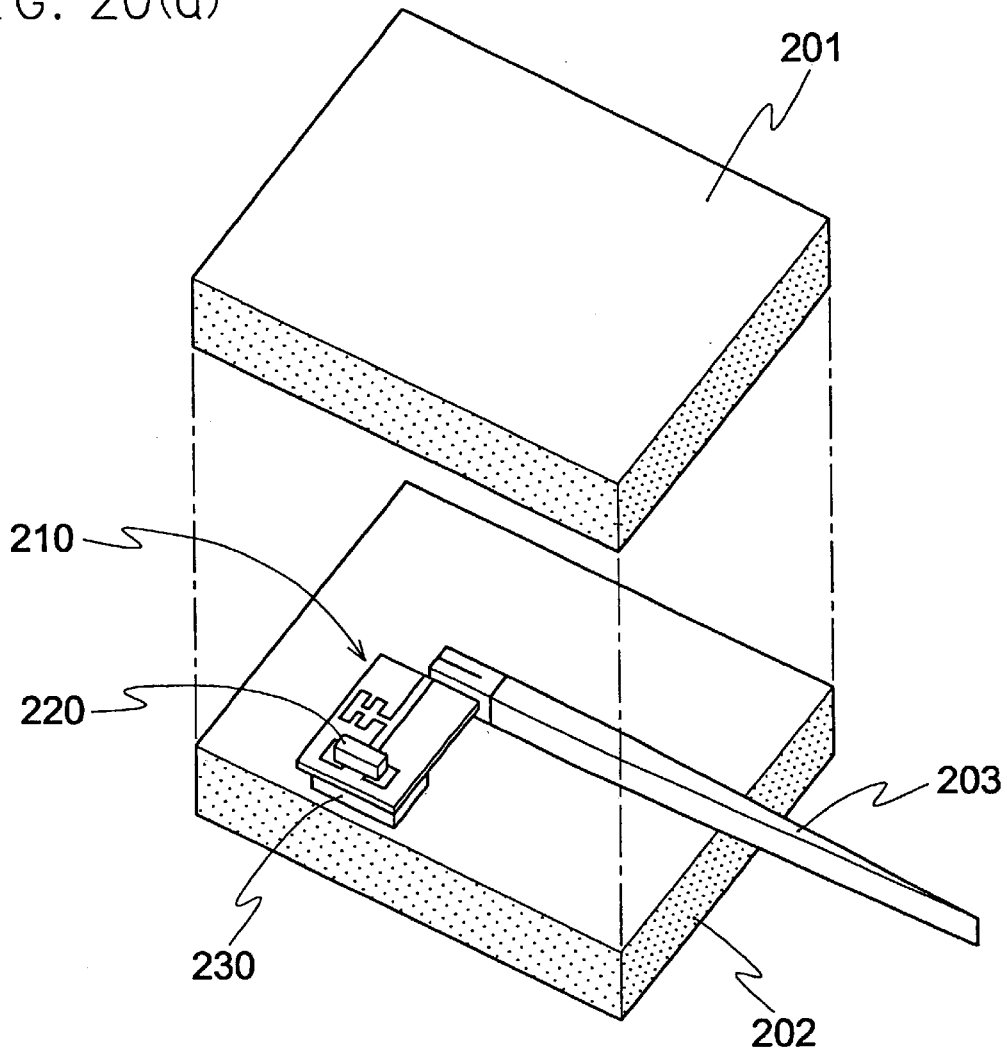
FIG. 20(a) is a cross view of a NRD guide Gunn oscillator according to an embodiment of the present invention, and FIG. 20(b) a side view thereof.
Figure 20B:
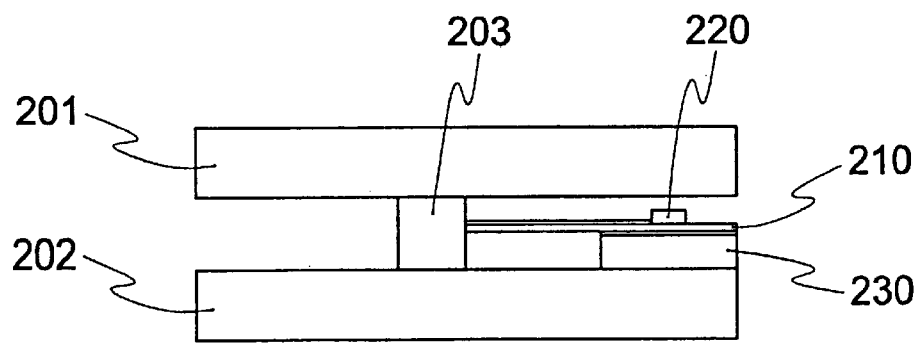

FIG. 20 is a view showing an arrangement of a NRD guide Gunn oscillator according to the sixth embodiment of the present invention. The NRD guide circuit is arranged in that a dielectric strip line 203 is pinched between two metallic parallel plates 201, 202 and is thus of conventional arrangement. In the present embodiment, a Gunn diode 220 is mounted on an upper surface of a line substrate 210 that is supported with respect to the flat plate 202 via heat sink 230 arranged for grounding, heat dissipating and height adjustment purposes.

Figure 21A:
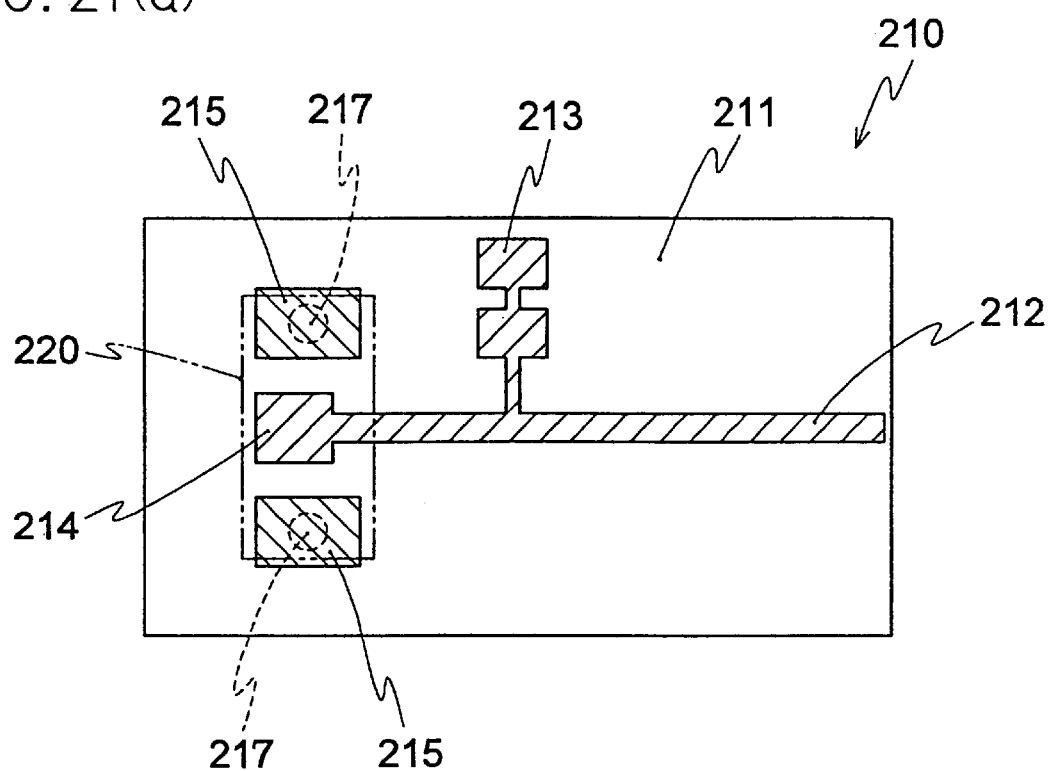
FIG. 21(a) is a plan view of a line substrate, and FIG. 21(b) a view of a rear surface thereof.
Figure 21B:
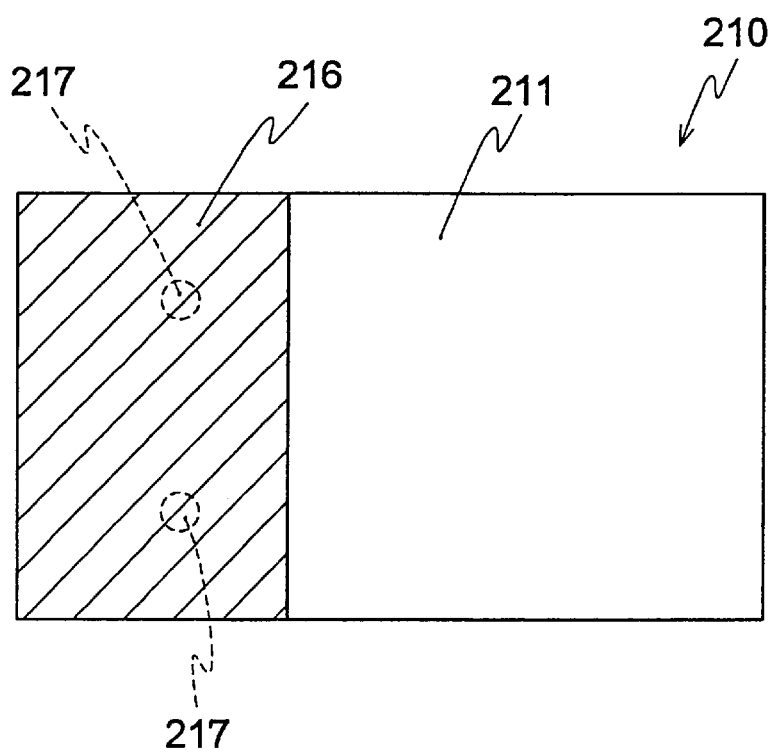

The line substrate 210 is arranged, as shown in FIGS. 21(a) and (b), by forming onto an upper surface of a semi-insulating or insulating plate substrate 211 (which may, for instance, by of AlN, Si, SiC or diamond having a resistivity of not less than $10^6$ Ωcm and a thermal conductivity of not less than 140 W/mK), a signal line 212, a choke portion 213 for applying direct-current bias onto the signal line 212, a signal electrode 214 elongated to an end portion of the signal line 212, and a pair of surface ground electrodes 215 disposed as to pinch the signal electrodes 214 between. A ground electrode 216 is formed on a rear surface of the substrate, and the surface ground electrodes 215 are connected to the ground electrode 216 through via holes 217. The line substrate 210 does not comprise ground electrodes on the rear surface of the signal line 212 and thus forms a suspended microstrip.

Figure 22A:
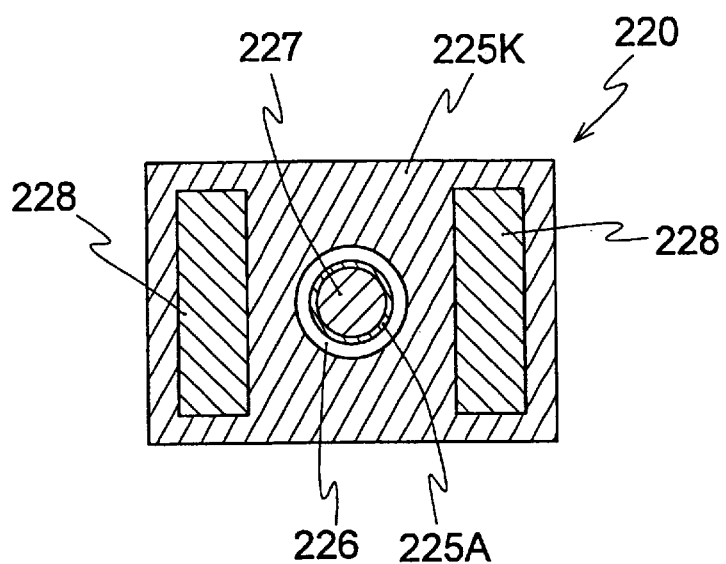
FIG. 22(a) is a top view of a Gunn diode, FIG. 22(b) a sectional view thereof, and (c) a sectional view of a Gunn diode according to an alternative example.

The Gunn diode 220 is formed, as shown in FIGS. 22(a) and (b), by laminating onto an upper surface of a semiconductor substrate 221 a first contact layer 222, an active layer 223, a second contact layer 224 and a metal layer 225, wherein a circular concave portion 226 is formed such that it substantially reaches from the metal layer 225 to the first contact layer 222. With this arrangement, the metal layer 225 is sub-divided into anode electrode 225A and cathode electrode 225K, and a bump 227 of Au that is easy to be bonded through thermo-compression is formed on the anode electrode 225A and a bump 228 similarly of Au on the cathode electrode 225K, such that their heights are respectively of same level. These bumps 227, 228 are equivalent to anode electrode 225A and cathode electrodes 225K respectively.

In one example, the semiconductor substrate 221 may be of n-type gallium arsenide having an impurity concentration of 1 to $2 \times 10^{18}$ atom/cm$^3$, a first contact layer 222 of n-type gallium arsenide having an impurity concentration of $2 \times 10^{18}$ atom/cm$^3$ and a thickness of 1.5 μm, an active layer 223 of n-type gallium arsenide having an impurity concentration of $1.2 \times 10^{16}$ atom/cm$^3$ and a thickness of 1.6 μm, and a second contact layer 224 of n-type gallium arsenide having an impurity concentration of $1 \times 10^{18}$ atom/cm$^3$ and a thickness of 0.3 μm. It is also possible to employ an alternative compound semiconductor such as indium phosphide instead of gallium arsenide.

In the Gunn diode 220, an area of the sub-divided portion of the active layer corresponding to the anode electrode 225A is set to be an area with which a specified operating current of the Gunn diode can be obtained (transverse cross section). Further, an area of the active layer corresponding to the cathode electrode 225K is set to be not less than ten times as large as the area of the active layer corresponding to the anode electrode 225A, and the electric resistance of a semiconductor laminated portion below the cathode electrode 225K is made to be not more than 1/10 of that of a semiconductor laminated portion below the anode electrode 225A. With these arrangements, this portion is not made to function as a Gunn diode but to function as a resistance of substantially low value.

Figure 22B:
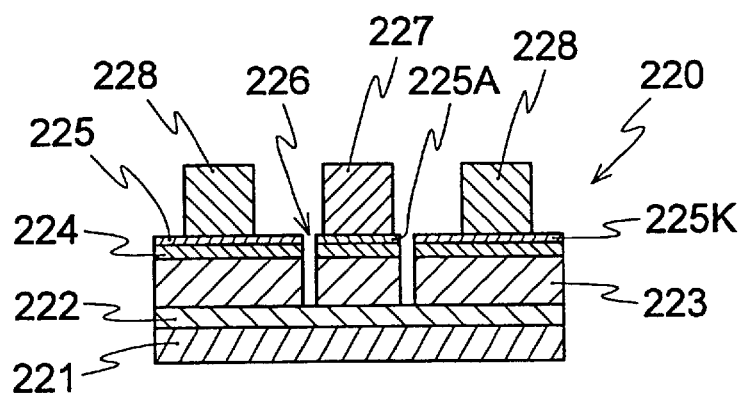
Figure 22C:
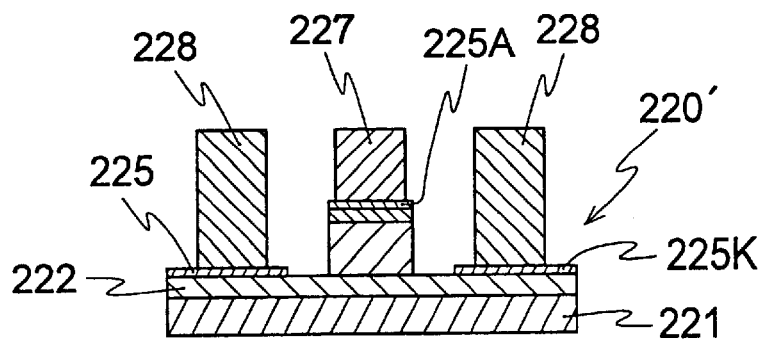

It should be noted that the Gunn diode 220 may be alternatively arranged, as shown in FIG. 22(c), to be Gunn diode 220' in which the second contact layer 224 and active layer 223 underlying the cathode electrode 225K of FIG. 22(b) are omitted, wherein the cathode electrode 225K is directly adhered to the first contact layer 222 and bumps 228 thereof are provided to be of the same height levels as the bump 227 of anode cathode 225A.

Assembly and mounting of the Gunn diode 220 to the plate substrate 211 of the line substrate 210 is performed in that the bump 227 of the anode electrode 225A is connected to the signal electrode 214 and the pair of bumps 228 of the cathode electrodes 225K to the pair of surface ground electrodes 215 through thermo-compression bonding. By making the portion of the ground electrodes 216 of the line substrate 210 be connected to the heat sink 230, they are grounded to the flat plate 202 through this heat sink 230.

Assembly of the line substrate 210 to the NRD guide circuit is performed, as shown in FIGS. 20(a) and (b), in that the plate substrate 211 of the line substrate 210 is made parallel with respect to parallel plates 201, 202, and in that the tip of the signal line 212 approaches the base portion of the dielectric strip line 203 from a vertical direction.

In case direct-current voltage is applied on the choke portion 213, current is supplied through the signal line 212, signal electrode 214, Gunn diode 220, surface ground electrodes 215, via holes 217, ground electrode on the rear surface 216, heat sink 230, and plate 202 in this order, whereby electromagnetic waves (microwaves) are generated at the Gunn diode 220 and reach lateral surfaces of the dielectric strip line 203 through the signal line 212. The electromagnetic waves are here transformed into the NRD guide circuit (LSM mode) and are transmitted in the dielectric strip line 203.

Since the choke portion 213 is formed on the plate substrate 211 in this embodiment, the choke portion can be formed simultaneously with the signal line 212, signal electrode 214, and surface ground electrodes 215 through etching, whereby simple fabrication is enabled without the need of removal of the substrate to improve efficiency of assembling. Further, since the Gunn diode 220 is directly mounted onto the plate substrate 211 in a face down posture, no parasitic inductance is generated unlike cases in which ribbons are used. Since heat generated at the Gunn diode is transmitted to the heat sink 230 through bumps 227, 228 or the plate substrate 211 that presents high thermal conductivity, the heat releasing effect can be improved. Also, since the Gunn diode 220 is supported by the bumps 228 of the cathode electrodes 225K from both sides, it can be prevented that excessive load is applied to the semiconductor laminated portion in the center that substantially functions as the Gunn diode.

It should be noted that while the portion of the signal line 212 and the portion to which the Gunn diode 220 is mounted are provided on a common plate substrate 211, they may be arranged on different substrates and may be connected by a conductive line such as gold ribbon. Also, the via holes 217 may be replaced by ribbons or the like for connecting the surface ground electrodes 215 to the ground electrode 216 on the rear surface.

Further, while the signal line 212 of the line substrate 210 is a suspended microstrip line in the above described example, the ground electrode 216 may be provided on the whole rear surface of the plate substrate 211 to make up a microstrip line. Such a line may alternatively be a coplanar waveguide in which a signal line is provided in the center of the upper surface of the plate substrate 211 and a pair of ground electrodes are provided on the same plane as to pinch the signal line between. In this case, the bump 227 of the anode electrode 225A shall be connected to the signal line in the center and the bumps 228 of the cathode electrodes 225K on both sides to the ground electrodes.

Further, the anode electrode 225A and cathode electrode 225K of the Gunn diode 220 may be reversed, depending on the concentration gradient of the active layer, and in such a case, the polarity of voltage applied to the choke portion 213 shall be suitably selected.

Figure 23:
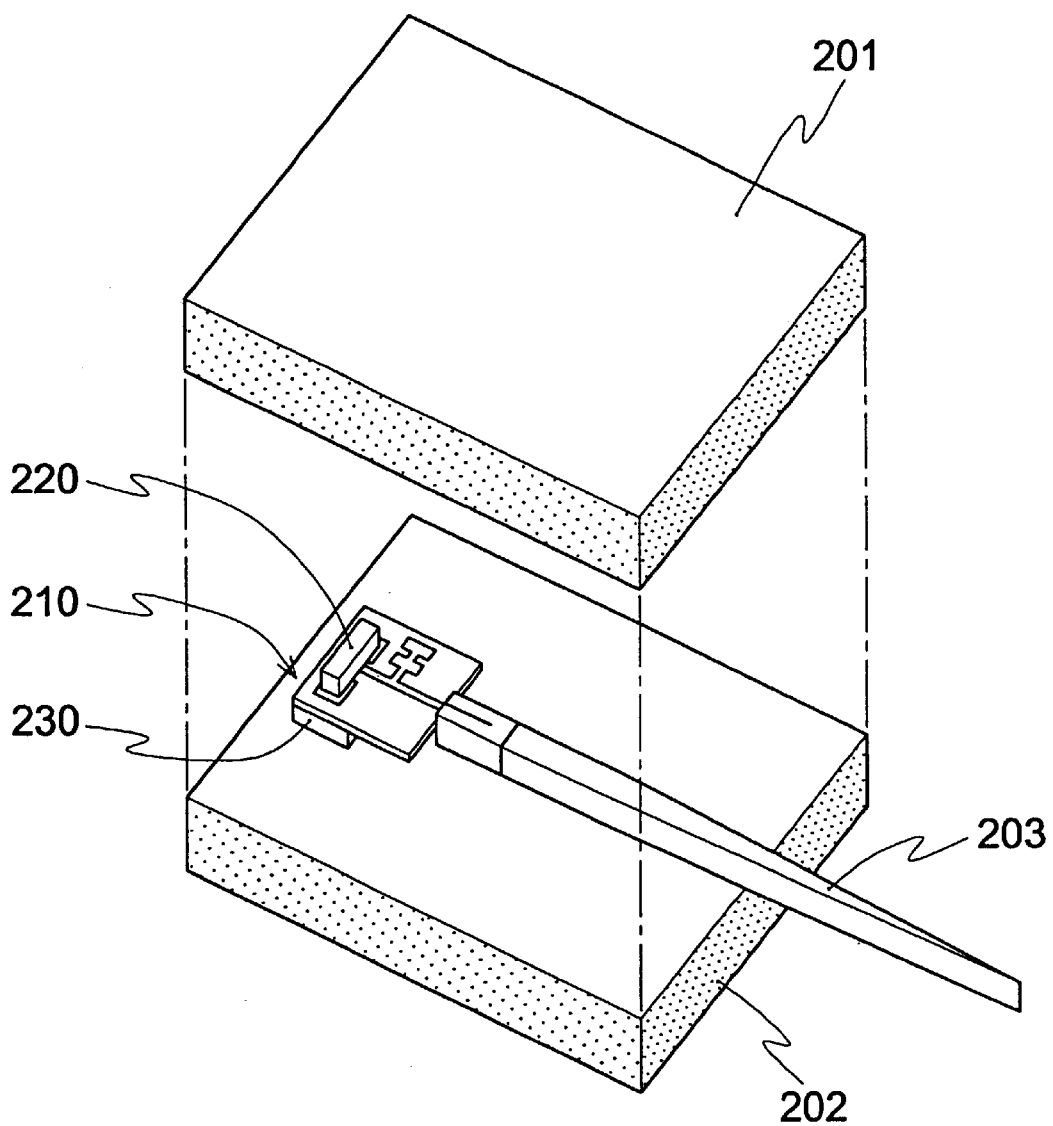
FIG. 23 is a cross view of a NRD guide Gunn oscillator according to another embodiment of the present invention.

FIG. 23 is a view showing an alternative example of a NRD guide Gunn oscillator. In this example, the direction of a line substrate 210 on which the Gunn diode is fabricated and supported by heat sink 230 is set to be parallel to parallel plates 201, 202 and such that a tip of its signal line 212 is in alignment with a base end of dielectric strip line 203 in straight line. Here, the transmission mode of electromagnetic waves to be transmitted through the dielectric strip line 203 is a LSE mode.

Figure 24:
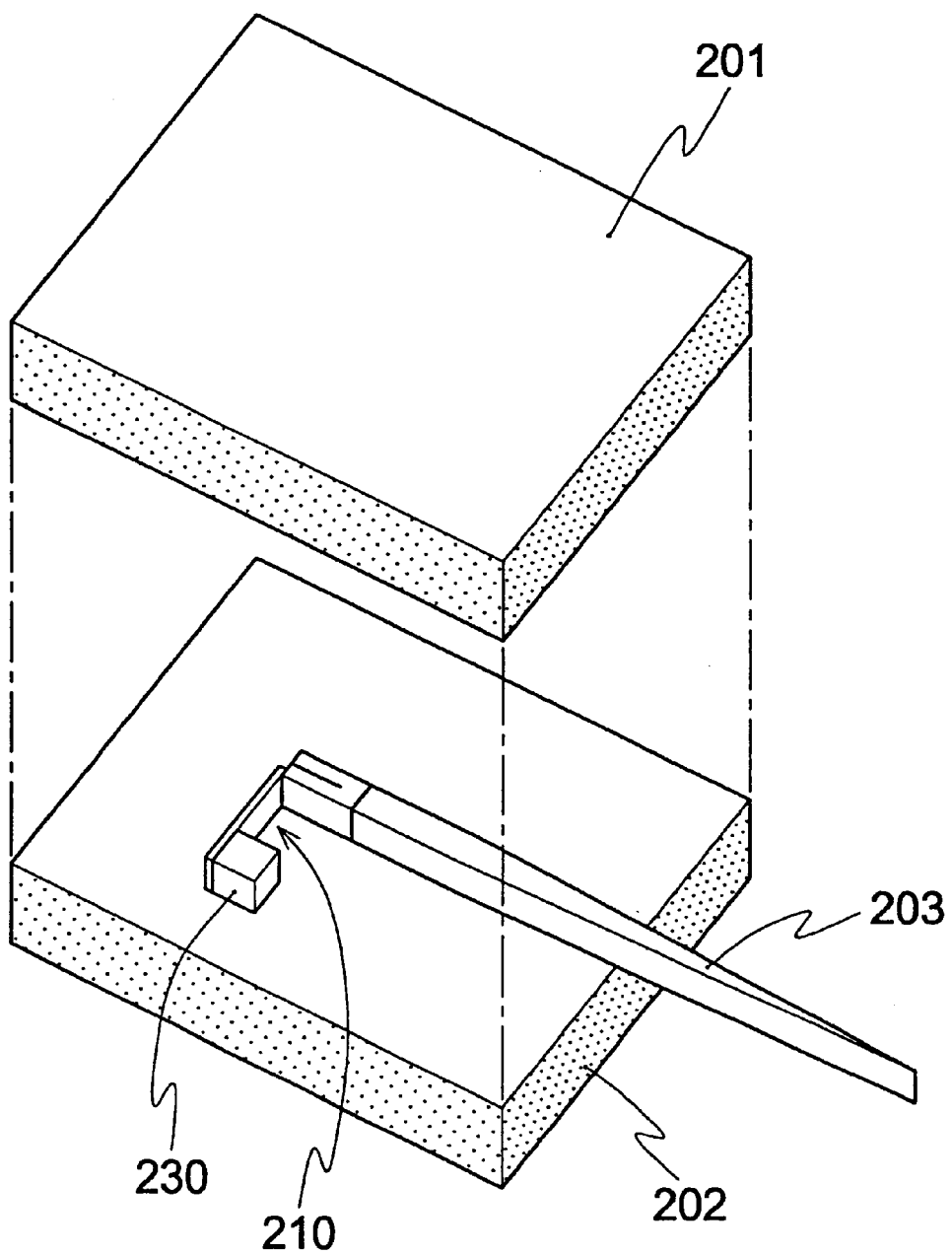
FIG. 24 is a cross view of a NRD guide Gunn oscillator according to still another embodiment of the present invention.

In FIG. 24, the line substrate 210 is mounted such that it is in vertical relationship with respect to the parallel plates 201, 202. This embodiment presents an advantage in that high-order modes are hardly raised in the signal line 212. It should be noted that it is also possible to employ an arrangement as shown in FIG. 23 in that the dielectric strip line 203 is in alignment with the signal line 212 and that the line substrate 210 is mounted in a vertical manner with respect to the parallel plates 201, 202.

EMBODIMENT 7

Figure 25:
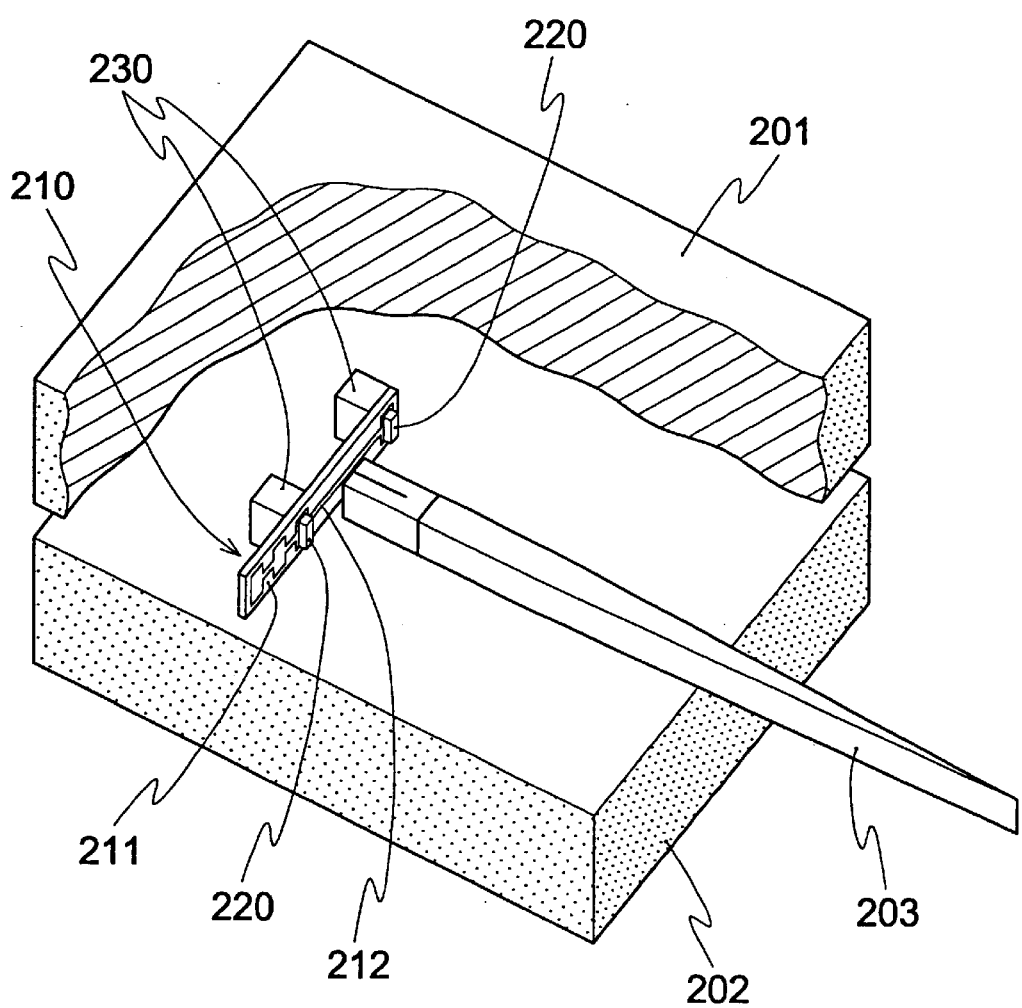
FIG. 25 is a cross view of a NRD guide Gunn oscillator according to yet another embodiment of the present invention.

FIG. 25 is a view showing an arrangement of a NRD guide Gunn oscillator according to the seventh embodiment of the present invention. The NRD guide circuit is arranged in that a dielectric strip line 203 is pinched between two metallic parallel plates 201, 202 and is thus of conventional arrangement. In the present embodiment, two Gunn diodes 220 are mounted on a line substrate 210 that are supported with respect to the flat plate 202 via heat sink 230 arranged for grounding and heat dissipation purposes.

Figure 26A:
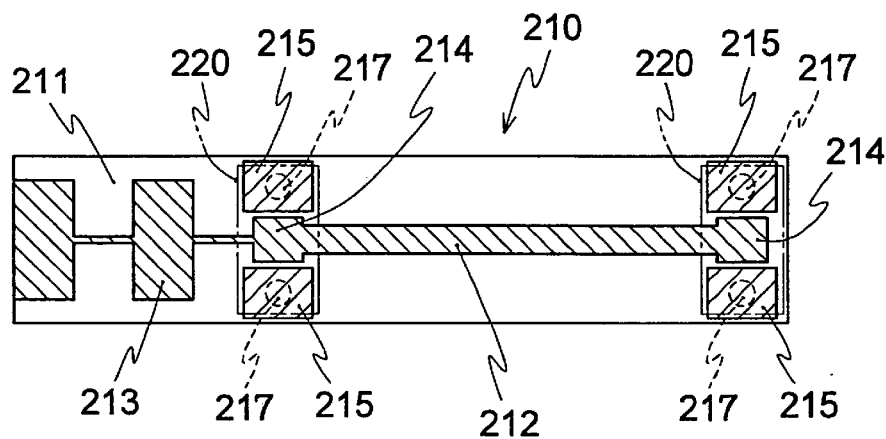
FIG. 26(a) is a top view of a line substrate, and FIG. 26(b) a view of a rear surface thereof.
Figure 26B:
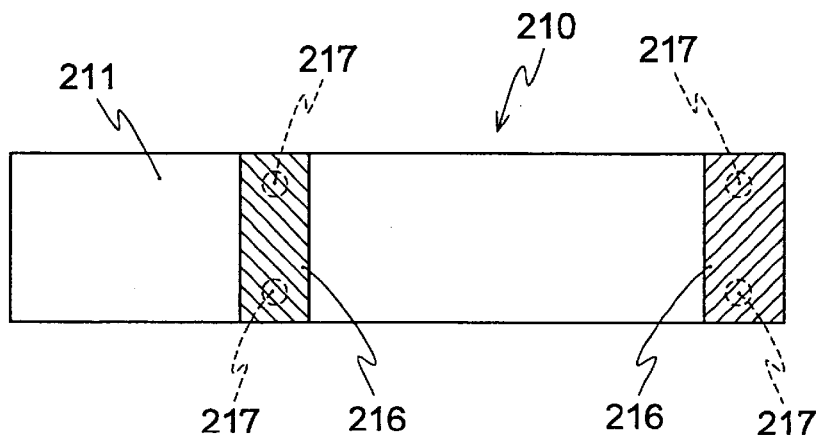

The line substrate 210 is arranged, as shown in FIGS. 26(a) and (b), by forming onto an upper surface of a semi-insulating or insulating plate substrate 211 (which may, for instance, be of AlN, Si, SiC or diamond having a resistivity of not less than $10^6$ Ωcm and a thermal conductivity of not less than 140 W/mK), a signal line 212, a choke portion 213 for applying direct-current bias onto the signal line 212, two signal electrodes 214 connected to both end portions of the signal line 212, and two pairs of surface ground electrodes 215 disposed as to pinch the two signal electrodes 214 between. A ground electrode 216 is formed on a rear surface of the substrate, and the surface ground electrodes 215 are connected to the ground electrode 216 through via holes 217. The line substrate 210 does not comprise ground electrodes on the rear surface of the signal line 212 and forms a suspended microstrip line.

Figure 27A:
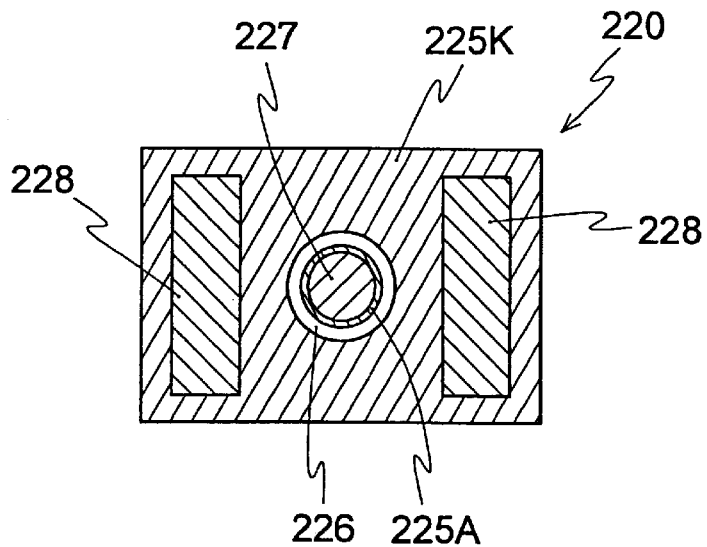
FIG. 27(a) is a top view of a Gunn diode, FIG. 27(b) a sectional view thereof, and FIG. 27(c) a sectional view of a Gunn diode of an alternative example.
Figure 27B:
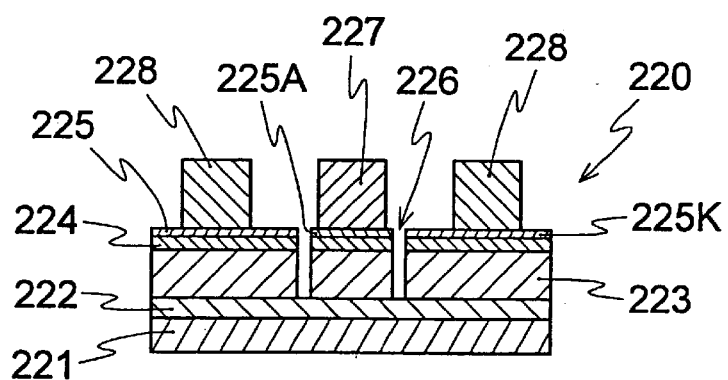

The Gunn diode 220 is formed, as shown in FIGS. 27(a) and (b), by laminating onto an upper surface of a semiconductor substrate 221 a first contact layer 222, an active layer 223, a second contact layer 224 and a metal layer 225, wherein a circular concave portion 226 is formed such that it substantially reaches from the metal layer 225 to the first contact layer 222. With this arrangement, the metal layer 225 is sub-divided into anode electrode 225A and cathode electrode 225K, and a bump 227 of Au that is easy to be bonded through thermo-compression is formed on the anode electrode 225A and a bump 228 similarly of Au on the cathode electrode 225K, such that their heights are respectively of same level. These bumps 227, 228 are equivalent to anode electrode 225A and cathode electrode 225K respectively. In one example, the semiconductor substrate 221 may be of n-type gallium arsenide having an impurity concentration of 1 to $2 \times 10^{18}$ atom/cm$^3$, a first contact layer 222 of n-type gallium arsenide having an impurity concentration of $2 \times 10^{18}$ atom/cm$^3$ and a thickness of 1.5 µm, an active layer 223 of n-type gallium arsenide having an impurity concentration of $1.2 \times 10^{16}$ atom/cm$^3$ and a thickness of 1.6 µm, and a second contact layer 224 of n-type gallium arsenide having an impurity concentration of $1 \times 10^{18}$ atom/cm$^3$ and a thickness of 0.3 µm. It is also possible to employ an alternative compound semiconductor such as indium phosphide instead of gallium arsenide. In the Gunn diode 220, an area of the sub-divided portion of the active layer corresponding to the anode electrode 225A is set to be an area with which a specified operating current of the Gunn diode can be obtained (transverse cross section).

Further, an area of the active layer corresponding to the cathode electrode 225K is set to be not less than ten times as large as the area of the active layer corresponding to the anode electrode 225A, and the electric resistance of a semiconductor laminated portion below the cathode electrode 225K is made to be not more than ¹⁄₁₀ of that of a semiconductor laminated portion below the anode electrode 225A. With these arrangements, this portion is not made to function as a Gunn diode but to function as a resistance of substantially low value.

Figure 27C:
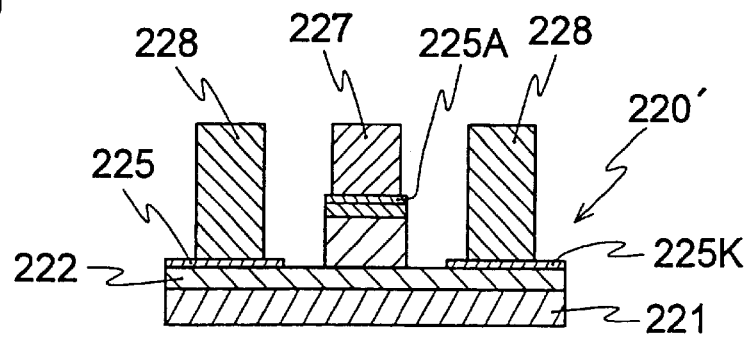

It should be noted that the Gunn diodes 220 may be alteratively arranged, as shown in FIG. 27(c), to be Gunn diodes 220' in which the second contact layer 224 and active layer 223 underlying the cathode electrode 225K of FIG. 22(b) are omitted, wherein the cathode electrode 225K is directly adhered to the first contact layer 222 and bumps 228 thereof are provided to be of the same height levels as the bump 227 of anode electrode 225A.

Assembly and mounting each of the Gunn diodes 220 to the plate substrate 211 of the line substrate 210 is performed in that the bump 227 of the anode electrode 225A is connected to the signal electrode 214 and the pair of bumps 228 of the cathode electrodes 225K to the pair of surface ground electrodes 215 through thermo-compression bonding. By making the portion of the ground electrodes 216 of the line substrate 210 be connected to the heat sink 230, they are grounded to the flat plate 202 through this heat sink 230. The other Gunn diode is similarly assembled.

Assembly of the line substrate 210 to the NRD guide circuit is performed, as shown in FIG. 25, in that the plate substrate 211 of the line substrate 210 is made vertical with respect to parallel plates 201, 202, and in that the center portion of the signal line 212 approaches the base portion of the dielectric strip line 203 from a vertical direction.

In case direct-current is applied to the choke portion 213, current is supplied through the signal electrode 214 to the Gunn diode 220 that is closer to the choke 213 and via the signal electrode 214 through the signal line 212 to the Gunn diode 220 that is remote from the chock 213, and via holes 217, ground electrode 216 on the rear surface, heat sink 230, and plate 202 in this order, whereby electromagnetic waves (microwaves) are generated at the two Gunn diodes 220. The generated electromagnetic waves are resonated at the signal line 212 and a part thereof is combined with the dielectric strip line 203 for transmission.

Since the choke portion 213 is formed on the plate substrate 211 in this embodiment, the choke portion can be formed simultaneously with the signal line 212, signal electrode 214, and surface ground electrodes 215 through etching, whereby simple fabrication is enabled without the need of removal of the substrate to improve efficiency of assembling.

Further, since the Gunn diode 220 is directly mounted onto the plate substrate 211 in a face down posture, no parasitic inductance is generated unlike cases in which ribbons are used.

Since heat generated at the Gunn diodes 220 is transmitted to the heat sink 230 through bumps 227, 228 and the plate substrate 211 that presents high thermal conductivity, the heat dissipating effect can be improved. Also, since the Gunn diode 220 is supported by the bumps 228 of the cathode electrodes 225K from both sides, it can be prevented that excessive load is applied to the semiconductor laminated portion in the center that substantially functions as the Gunn diode.

Further, while the signal line 212 of the line substrate 210 is a suspended microstrip line in the above described example, the ground electrode 216 may be provided on the whole rear surface of the plate substrate 211 to make up a microstrip line. Such a line may alternatively be a coplanar waveguide in which a signal line is provided in the center of the upper surface of the plate substrate 211 and a pair of ground electrodes are provided on the same plane as to pinch the signal line between. In this case, the bump 227 of the anode electrode 225A shall be connected to the signal line in the center and the bumps 228 of the cathode electrodes 225K on both sides to the ground electrodes.

Further, the anode electrode 225A and cathode electrode 225K of the Gunn diode 220 may be reversed, depending on the concentration gradient of the active layer, and in such a case, the polarity of voltage applied to the choke portion 213 shall be suitably selected.

Figure 28:
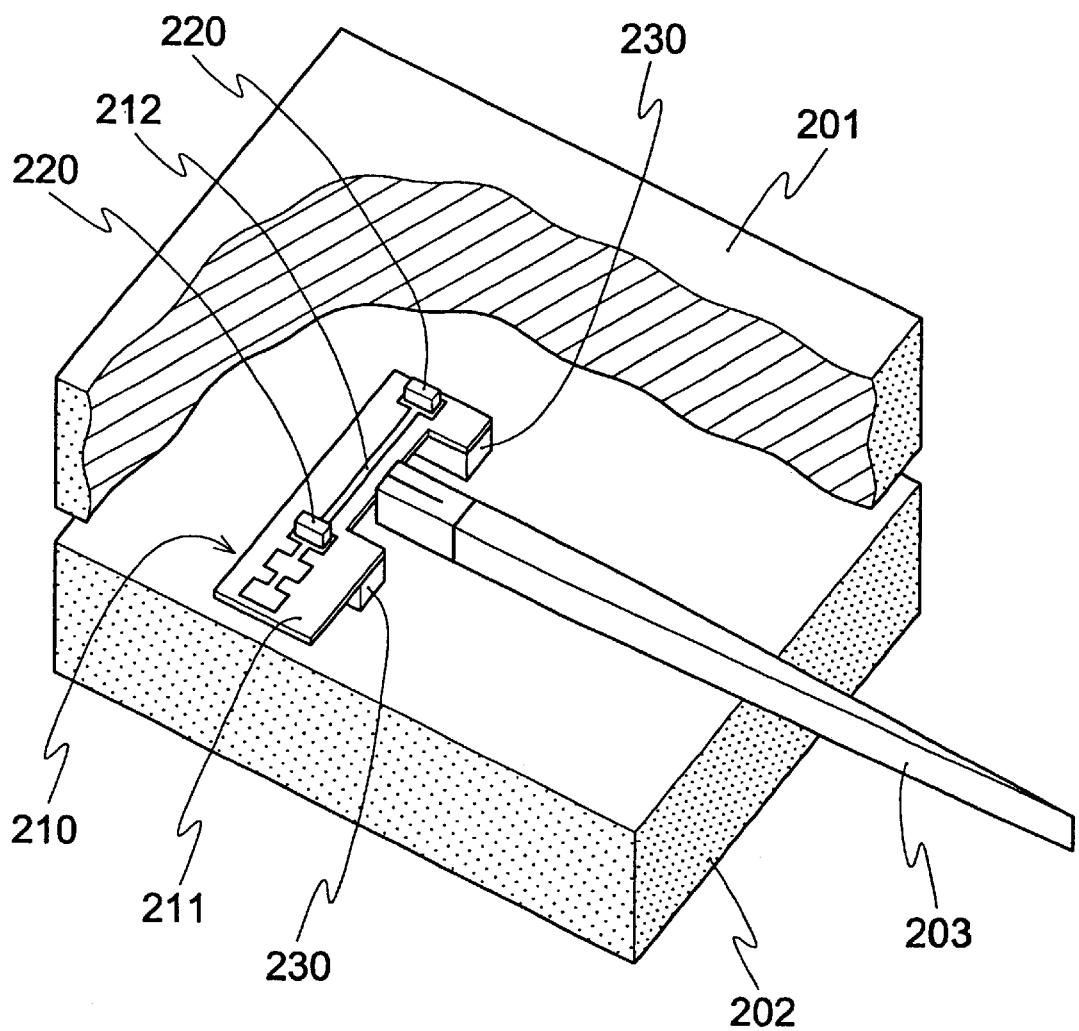
FIG. 28 is a cross view of a NRD guide Gunn oscillator according to another embodiment of the present invention.
Figure 29:
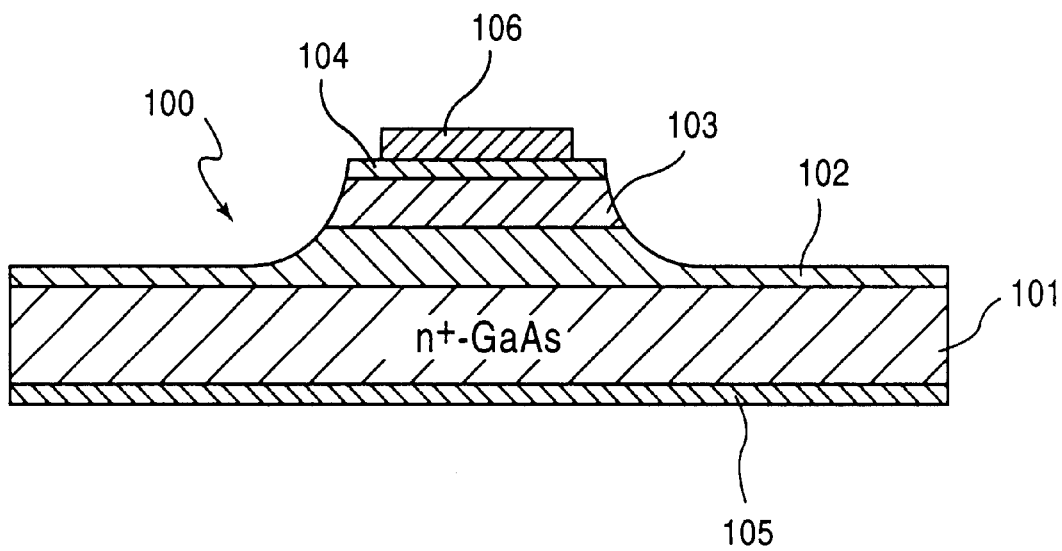
FIG. 29 is a sectional view of a conventional Gunn diode of mesa-type structure.
Figure 30:
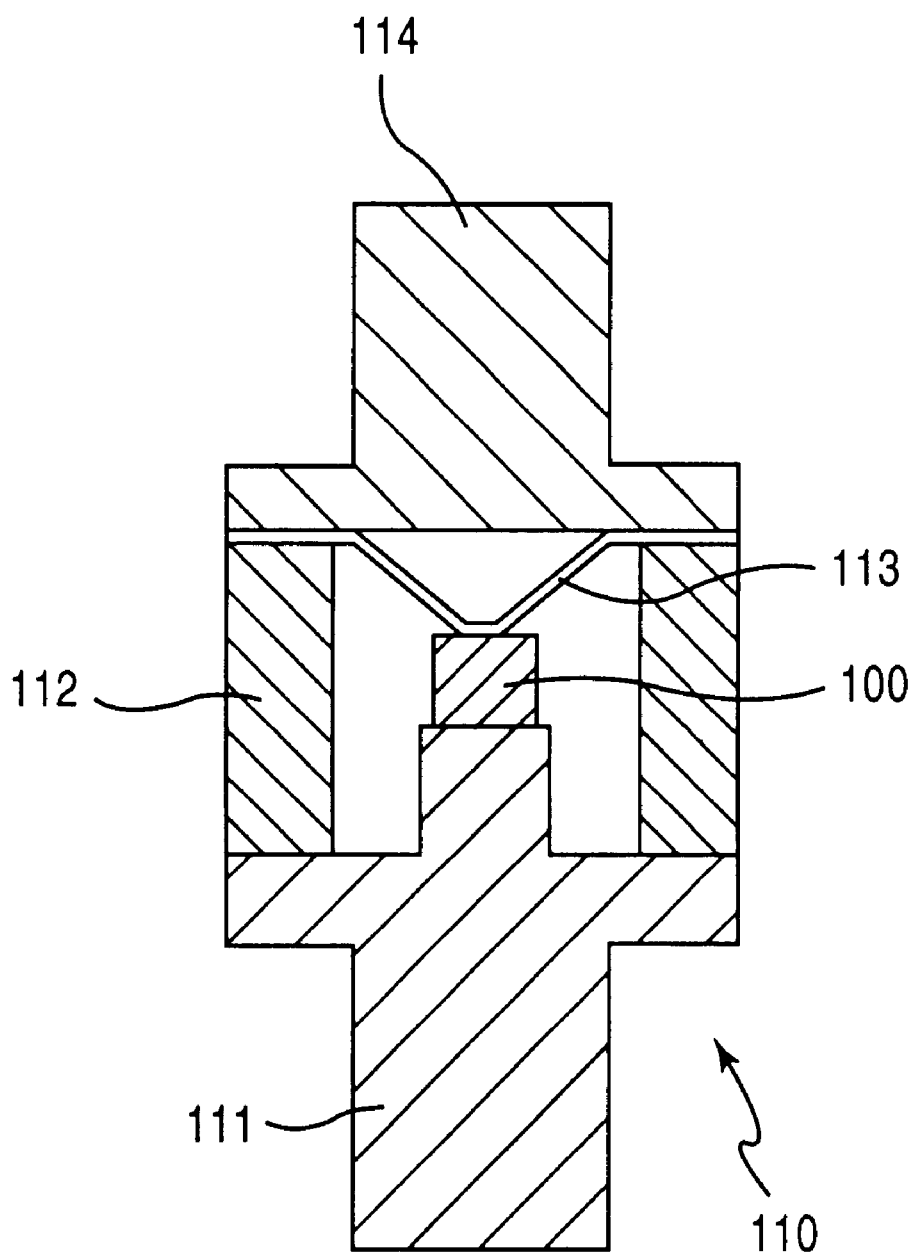
FIG. 30 is a sectional view of a conventional Gunn diode of mesa-type structure that is incorporated in pill-type package.
Figure 31:
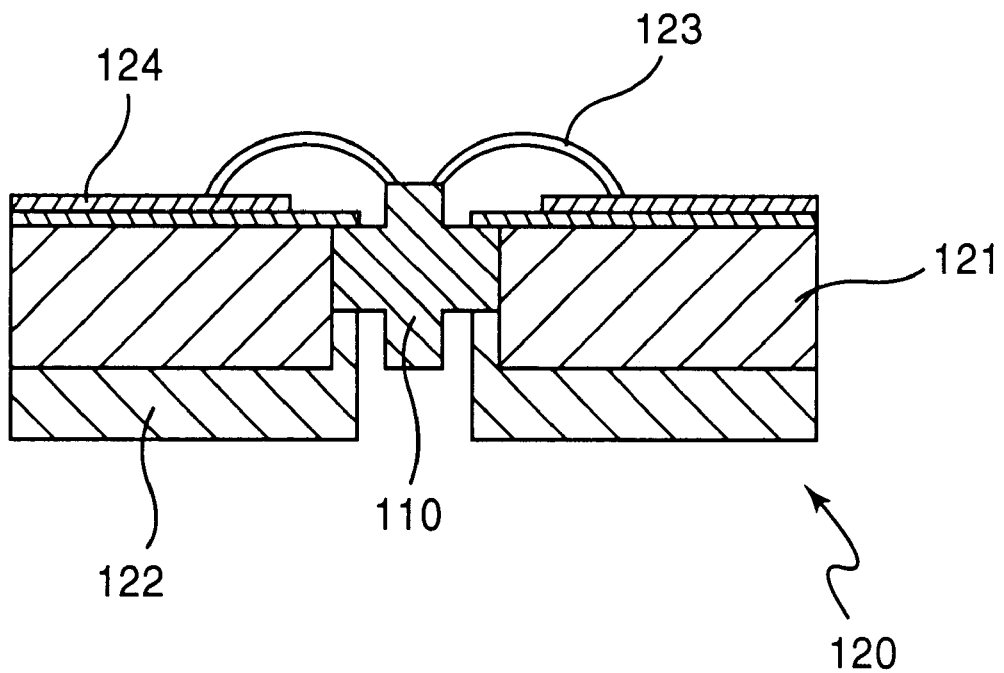
FIG. 31 is an explanatory view in which the pill-type package is mounted on a microstrip line.
Figure 32A:
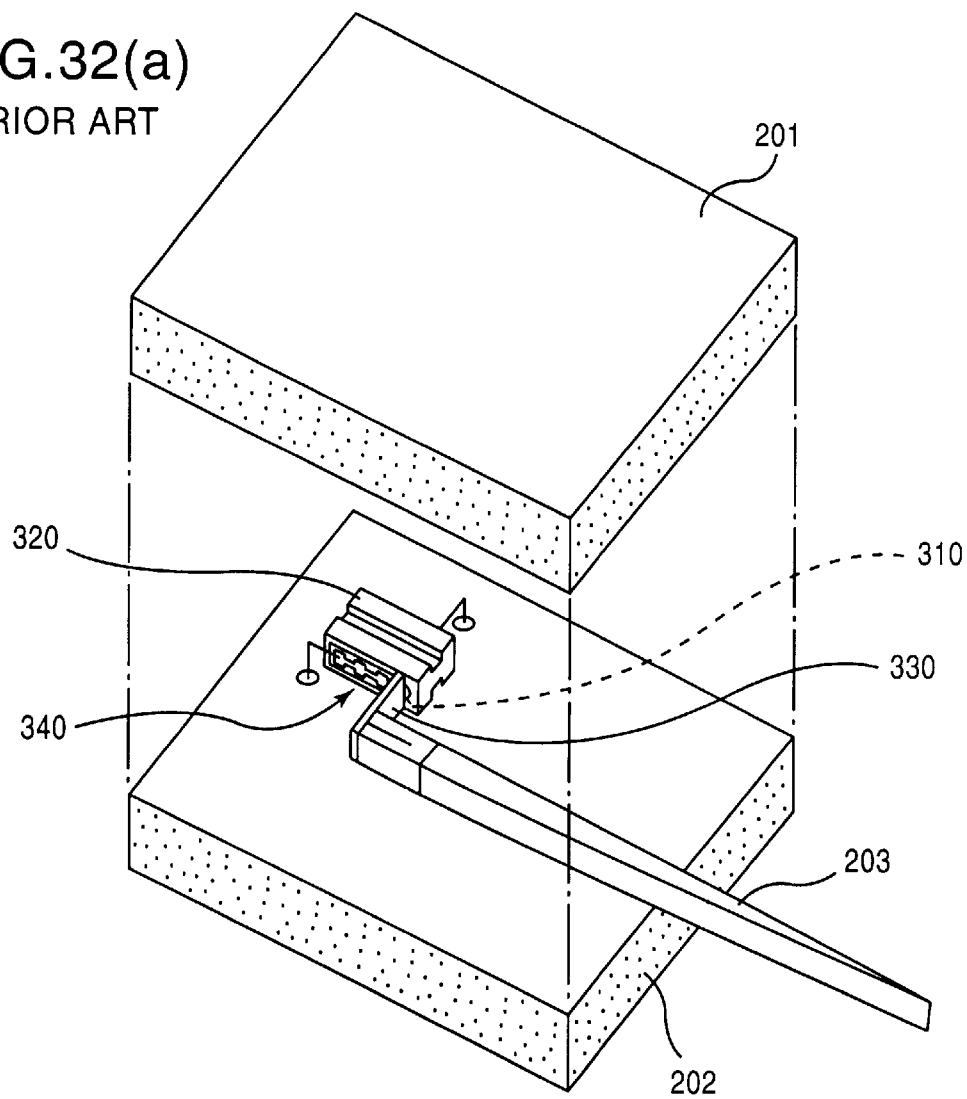
FIG. 32(a) is a cross view of a conventional NRD guide Gunn oscillator, and FIG. 32(b) a cross view of a resonator.
Figure 32B:
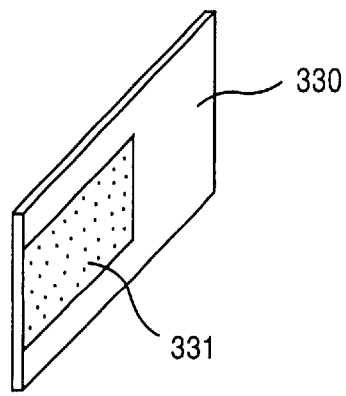
Figure 33A:
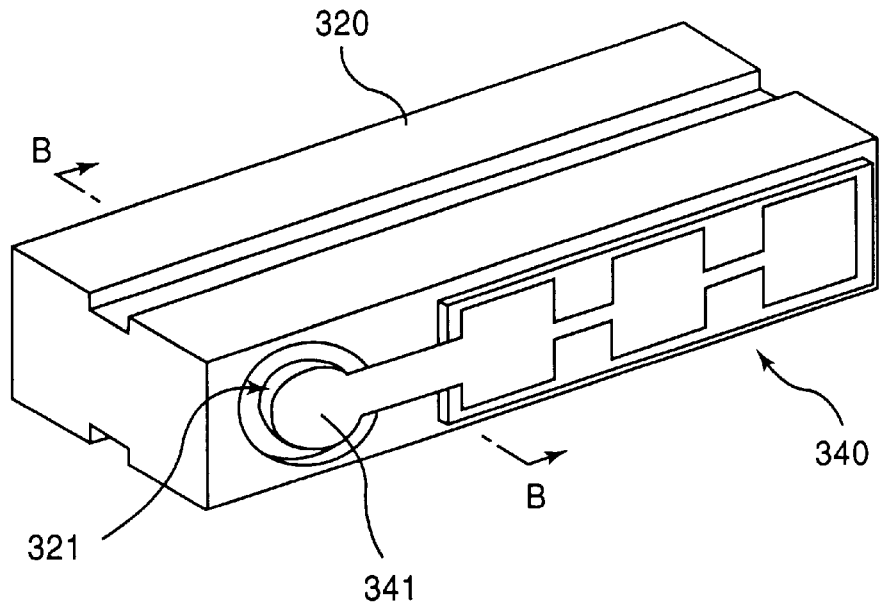
FIG. 33(a) is a cross view of a mount of the NRD guide Gunn oscillator as shown in FIG. 32 and FIG. 33(b) a sectional view taken along the line B—B.
Figure 33B:
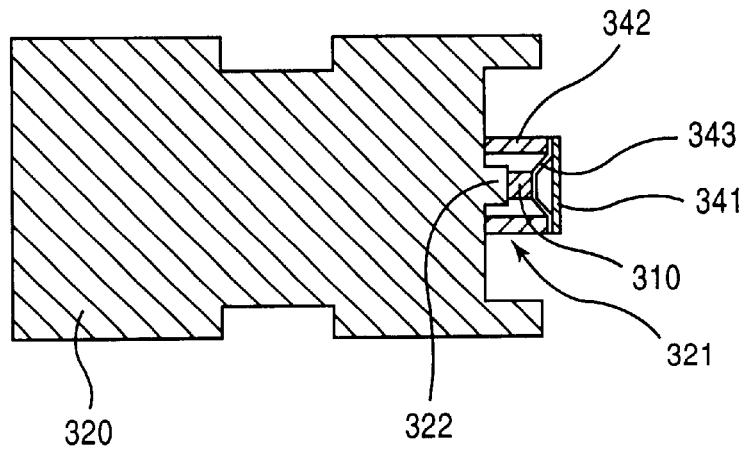

FIG. 28 is a view in which the line substrate 210 is mounted such that it is parallel with respect to the parallel plates 201, 202.

As explained so far, since etching for defining a region that is to function as a Gunn diode is performed by self-alignment dry etching utilizing electrode layers formed above this region as masks, variations in characteristics are restricted in the Gunn diode of the present invention.

Further, since the cathode electrode and anode electrode can be formed on a same plane to assume identical height levels in the Gunn diode of the present invention, the Gunn diode can be assembled in a face down posture. With this arrangement, the Gunn diodes do not need to be incorporated into conventional pill-type packages, whereby advantages in terms of fabrication are presented to enable easy assembly to plate substrates.

Also, since it is not required to connect the Gunn diode to minute electrodes through means such as gold ribbons at the time of assembly, parasitic inductance do not occur and variations in circuit characteristics owing to variations in lengths of the gold ribbon or the like can be eliminated.

Further, the arrangement of a plurality of individual mesa-type structured portions that substantially function as a Gunn diode remarkably improves the heat dissipating efficiency, and the conversion efficiency or output power can be largely improved.

In case of an assembly arranged with an oscillator, a portion of the oscillator is shielded by the Gunn diode or, in addition thereto, by a conductive plate substrate, phase noise can be largely decreased and the Q increased.

Further, connection for bias applying between the choke and the Gunn diode is made simple to enable simple fabrication whereby efficiency of operation is improved. No ribbon is required for mounting the Gunn diode, whereby generation of parasitic inductance can be prevented. Additionally, heat generated at the Gunn diode is transmitted to the heat sink through the substrate, heat dissipating effects can be improved.

Also, connection for bias applying between the choke and the Gunn diode is made simple to enable simple fabrication whereby efficiency of operation is improved.

No ribbon is required for mounting the Gunn diode, whereby generation of parasitic inductance can be prevented.

Additionally, heat generated at the Gunn diode is transmitted to the heat sink through the substrate, heat dissipating effects can be improved.

What is claimed is:

1. A fabricating method of a Gunn diode comprising:
   a first step of sequentially laminating and forming a first semiconductor layer which serves as a first contact layer, an active layer, and a second semiconductor layer which serves as a second contact layer onto a semiconductor substrate;
   a second step of forming first and second electrodes of specified shapes for applying voltage to the active layer directly onto the second contact layer in such a manner that the first and second electrodes are formed on the same plane and that the second electrode is so arranged to surround the first electrode;
   and a third step of removing the second semiconductor layer and the active layer through dry etching wherein the first and second electrodes are used as masks.

2. The fabricating method of claim 1, wherein the second step includes a step of forming, after forming an underlying electrode layer for the first and second electrodes of specified shapes, conductive protrusions on the underlying electrode layer such that their heights are substantially identical with each other.

3. The fabricating method of any one of claims 1 and 2, wherein the semiconductor substrate, the first semiconductor layer, the active layer and the second semiconductor layer are formed of compound semiconductors.

4. The fabricating method of claim 3, wherein the compound semiconductors are selected from gallium arsenide or indium phosphide.

* * * * *

UNITED STATES PATENT AND TRADEMARK OFFICE
CERTIFICATE OF CORRECTION

PATENT NO. : 6,514,832 B1 Page 1 of 1
DATED : February 4, 2003
INVENTOR(S) : Nakagawa, Atsushi It is certified that error appears in the above-identified patent and that said Letters Patent is hereby corrected as shown below:

<u>Title Page,</u>
Item [54], Title, please replace the title to read as follows:
-- FABRICATING METHOD OF GUNN DIODE--.
Item [75], Inventors, please delete "Kenichi Watanabe, Kamifukuoka (JP)".

<u>Column 13,</u>
Line 62, please replace the paragraph:
-- FIG. 16 is a view showing an arrangement of an alternative example of a Gunn diode element 10A, wherein (a) is a top view and (b) a sectional view, In this arrangement, four anode electrodes 16 are individually formed and four concave portions 20 corresponding thereto make up to four Gunn diode portions of [[mess]] <u>mesa</u>-type structure. Since voltage is commonly applied to the individual Gunn diode portions of mesa-type structure, these are in parallel connected conditions during operation. --

Signed and Sealed this

Tenth Day of February, 2004

JON W. DUDAS
*Acting Director of the United States Patent and Trademark Office*